(12) United States Patent
McPartland et al.

(10) Patent No.: US 10,757,809 B1
(45) Date of Patent: Aug. 25, 2020

(54) AIR-COOLED HEAT EXCHANGER AND THERMAL ARRANGEMENT FOR STACKED ELECTRONICS

(71) Applicant: Telephonics Corporation, Farmingdale, NY (US)

(72) Inventors: George McPartland, Massapequa, NY (US); Aleksander Vaysman, Brooklyn, NY (US)

(73) Assignee: Telephonics Corporation, Farmingdale, NY (US)

( * ) Notice: Subject to any disclaimer, the term of this patent is extended or adjusted under 35 U.S.C. 154(b) by 0 days.

(21) Appl. No.: 16/203,999

(22) Filed: Nov. 29, 2018

Related U.S. Application Data

(63) Continuation-in-part of application No. 16/188,998, filed on Nov. 13, 2018, now abandoned.
(Continued)

(51) Int. Cl.
  *H05K 1/02* (2006.01)
  *H05K 7/02* (2006.01)
  *H05K 1/14* (2006.01)

(52) U.S. Cl.
  CPC .......... *H05K 1/144* (2013.01); *H05K 1/0203* (2013.01); *H05K 7/02* (2013.01); *H05K 1/0272* (2013.01)

(58) Field of Classification Search
  CPC . H01L 23/467; H01L 23/473; H01L 23/3672; H01L 23/4006; G06F 1/203; G06F 1/20; G06F 2200/201; G06F 1/206; G06F 21/79; F28F 3/12; F28F 9/26; F28F 13/02; F28F 13/06; F28F 3/02; H05K 7/20327; H05K 7/20145; H05K 7/20154; H05K 7/20809; H05K 7/20272;
(Continued)

(56) References Cited

U.S. PATENT DOCUMENTS

| | | | |
|---|---|---|---|
| 3,384,154 | A | 5/1968 | Milton |
| 3,457,990 | A | 7/1969 | Theophilos |

(Continued)

FOREIGN PATENT DOCUMENTS

| | | |
|---|---|---|
| DE | 2155341 | 7/1972 |
| DE | 2801660 | 7/1979 |

(Continued)

*Primary Examiner* — Adam B Dravininkas
(74) *Attorney, Agent, or Firm* — Thomas A. O'Rourke; Bodner & O'Rourke, LLP

(57) ABSTRACT

A stacked electronic arrangement provides independent upgradability of active component boards and radiator boards, enabling quick changes in chip set and alternate polarizations, and includes: an active tile circuit card assembly (CCA); a passive radiator CCA; a tile frame; and a heat exchanger. The active tile CCA includes transmit/receive modules that accept, amply and transmit radar signals. The passive radiator CCA includes patch radiator plugins that receive and then radiate the amplified signal from the modules. The tile frame separates the active tile and the passive radiator CCAs. An elongated casing of the heat exchanger creates an accommodating space for air flow, and forms a first inlet, a second inlet, and a central exhaust plenum between the first and second inlets. High density tins are positioned within the accommodating space between the first and second inlets, and which have openings to the exhaust outlet.

6 Claims, 40 Drawing Sheets
(5 of 40 Drawing Sheet(s) Filed in Color)

Related U.S. Application Data

(60) Provisional application No. 62/585,019, filed on Nov. 13, 2017.

(58) Field of Classification Search
CPC .......... H05K 7/20263; H05K 7/20136; H05K 7/20254; H05K 1/144; H05K 7/02; H05K 1/0203; H05K 1/0272
See application file for complete search history.

(56) References Cited

U.S. PATENT DOCUMENTS

| | | | |
|---|---|---|---|
| 3,515,949 A | 6/1970 | Michaels | |
| 3,528,496 A | 9/1970 | Kun | |
| 4,120,019 A | 10/1978 | Arii | |
| 4,190,098 A | 2/1980 | Hanlon | |
| 4,401,155 A | 8/1983 | Royal | |
| 4,414,604 A | 11/1983 | Matsui | |
| 4,536,824 A | 8/1985 | Barrett | |
| 4,631,636 A | 12/1986 | Andrews | |
| 4,693,307 A | 9/1987 | Scarselletta | |
| 4,712,158 A | 12/1987 | Kikuchi | |
| 4,777,560 A * | 10/1988 | Herrell | H01L 23/3672 165/185 |
| 4,841,355 A | 6/1989 | Parks | |
| 4,860,444 A | 8/1989 | Herrell | |
| 4,884,631 A * | 12/1989 | Rippel | F28F 3/02 165/185 |
| 4,923,002 A | 5/1990 | Haussmann | |
| 5,001,601 A | 3/1991 | Fuoco | |
| 5,019,880 A * | 5/1991 | Higgins, III | H01L 23/467 165/80.3 |
| 5,142,441 A | 8/1992 | Seibold | |
| 5,181,167 A | 1/1993 | Davidson | |
| 5,245,508 A | 9/1993 | Mizzi | |
| 5,268,812 A | 12/1993 | Conte | |
| 5,283,715 A | 2/1994 | Carlsten | |
| 5,285,347 A | 2/1994 | Fox | |
| 5,293,930 A | 3/1994 | Pitasi | |
| 5,331,510 A | 7/1994 | Ouchi | |
| 5,404,272 A | 4/1995 | Lebailly | |
| 5,473,508 A | 12/1995 | Porter | |
| 5,628,363 A | 5/1997 | Dewar | |
| 5,847,927 A | 12/1998 | Minning | |
| 5,901,040 A | 5/1999 | Cromwell | |
| 5,914,856 A | 6/1999 | Morton | |
| 5,915,469 A | 6/1999 | Abramzon | |
| 5,946,190 A | 8/1999 | Patel | |
| 6,039,111 A | 3/2000 | Kawaguchi | |
| 6,061,235 A | 5/2000 | Cromwell | |
| 6,142,222 A | 11/2000 | Kang | |
| 6,191,945 B1 | 2/2001 | Belady | |
| 6,229,704 B1 | 5/2001 | Hoss | |
| 6,308,771 B1 | 10/2001 | Tavassoli | |
| 6,377,457 B1 | 4/2002 | Seshan | |
| 6,378,605 B1 | 4/2002 | Kutscher | |
| 6,426,874 B2 | 7/2002 | Kajiura | |
| 6,460,613 B2 | 10/2002 | Nash | |
| 6,775,137 B2 | 8/2004 | Chu | |
| 6,819,561 B2 | 11/2004 | Hartzell | |
| 6,819,563 B1 | 11/2004 | Chu | |
| 6,896,043 B2 * | 5/2005 | Dunn | F28D 9/0062 165/165 |
| 6,943,444 B2 | 9/2005 | von Gutfeld | |
| 6,988,535 B2 | 1/2006 | Upadhya | |
| 7,002,799 B2 | 2/2006 | Malone | |
| 7,100,682 B2 | 9/2006 | Okamoto | |
| 7,200,007 B2 | 4/2007 | Yasui | |
| 7,222,660 B2 | 5/2007 | Giacoma | |
| 7,245,485 B1 | 7/2007 | Morrell | |
| 7,334,422 B2 | 2/2008 | Zywiak | |
| 7,372,698 B1 | 5/2008 | Tilton | |
| 7,397,661 B2 | 7/2008 | Campbell | |
| 7,481,263 B2 | 1/2009 | Breier et al. | |
| 7,660,116 B2 | 2/2010 | Claassen | |
| 7,701,714 B2 | 4/2010 | Shabany | |
| 7,830,657 B2 | 11/2010 | Chu | |
| 7,905,096 B1 | 3/2011 | Campbell | |
| 7,952,875 B2 | 5/2011 | Woody | |
| 8,248,792 B2 | 8/2012 | Wei | |
| 8,341,967 B2 * | 1/2013 | Cheng | H01L 23/3675 62/3.6 |
| 8,462,504 B2 | 6/2013 | Chen | |
| 8,780,552 B2 | 7/2014 | El-Essawy | |
| 9,320,182 B2 | 4/2016 | Steger | |
| 9,685,714 B2 | 6/2017 | Milyakh | |
| 2001/0052412 A1 | 12/2001 | Tikka | |
| 2002/0015287 A1 | 2/2002 | Shao | |
| 2003/0205363 A1 | 11/2003 | Chu | |
| 2005/0061485 A1 | 3/2005 | Hirafuji | |
| 2005/0274501 A1 | 12/2005 | Agee | |
| 2007/0284095 A1 | 12/2007 | Wang | |
| 2009/0080173 A1 | 3/2009 | Porter | |
| 2009/0145581 A1 | 6/2009 | Hoffman | |
| 2009/0193652 A1 | 8/2009 | Salmon | |
| 2009/0310300 A1 | 12/2009 | Chrysler | |
| 2010/0294463 A1 * | 11/2010 | Nie | G06F 1/20 165/80.3 |
| 2011/0030923 A1 * | 2/2011 | Liang | F28D 15/0233 165/104.26 |
| 2011/0197598 A1 * | 8/2011 | Cheng | H01L 23/3675 62/3.6 |
| 2013/0155605 A1 * | 6/2013 | Du | G06F 1/203 361/679.46 |
| 2013/0168047 A1 * | 7/2013 | Wang | F28D 15/0233 165/104.13 |
| 2013/0177402 A1 * | 7/2013 | Horng | F04D 17/16 415/121.2 |
| 2014/0251585 A1 | 9/2014 | Kusuda | |
| 2016/0003128 A1 * | 1/2016 | Berger | F02B 29/0443 165/145 |
| 2018/0255662 A1 * | 9/2018 | Fan | F04D 17/025 |

FOREIGN PATENT DOCUMENTS

| | | |
|---|---|---|
| DE | 30 16 895 | 11/1981 |
| DE | 4320803 | 1/1995 |
| DE | 102004009500 | 8/2005 |
| WO | WO2005083784 | 8/2007 |

* cited by examiner

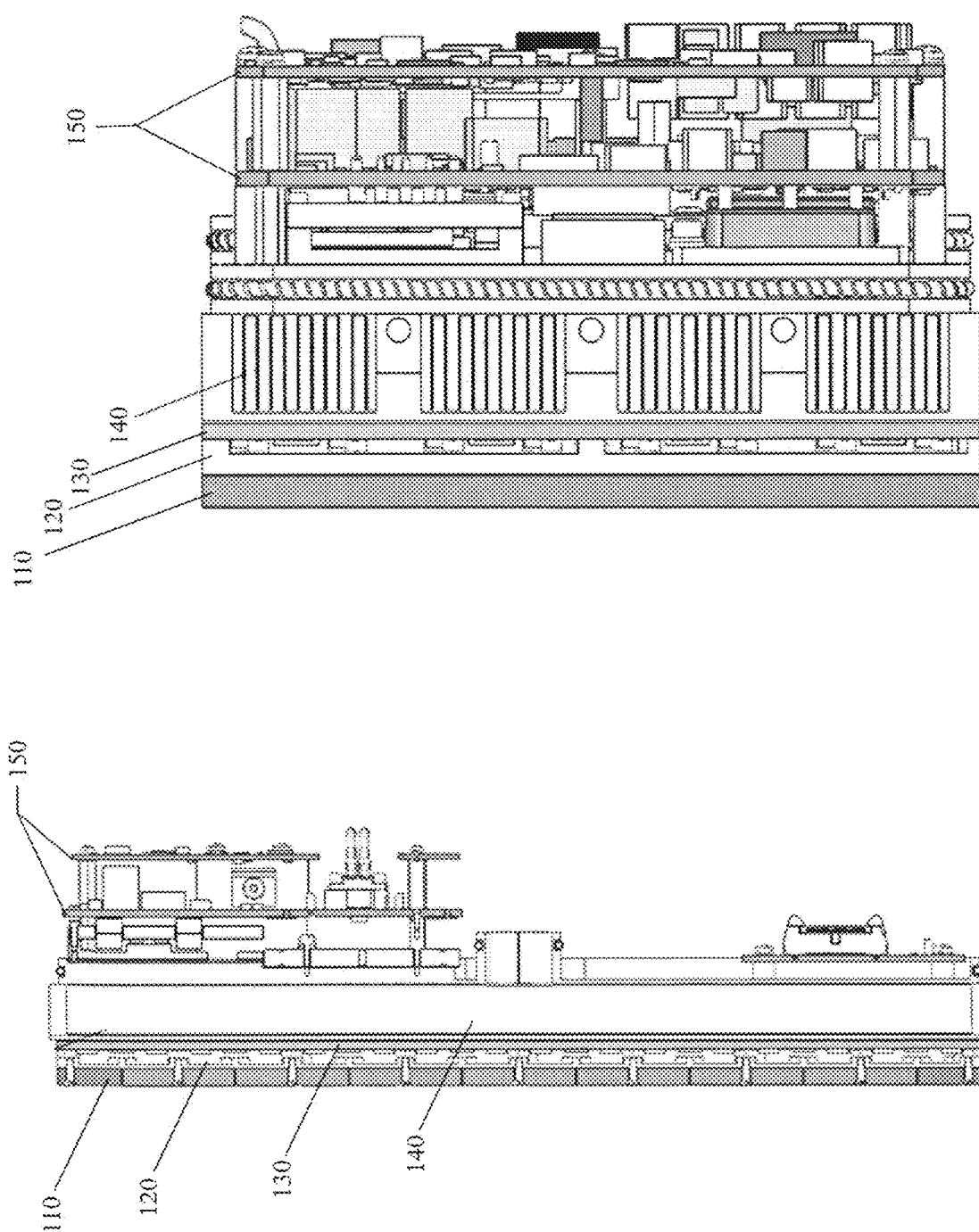

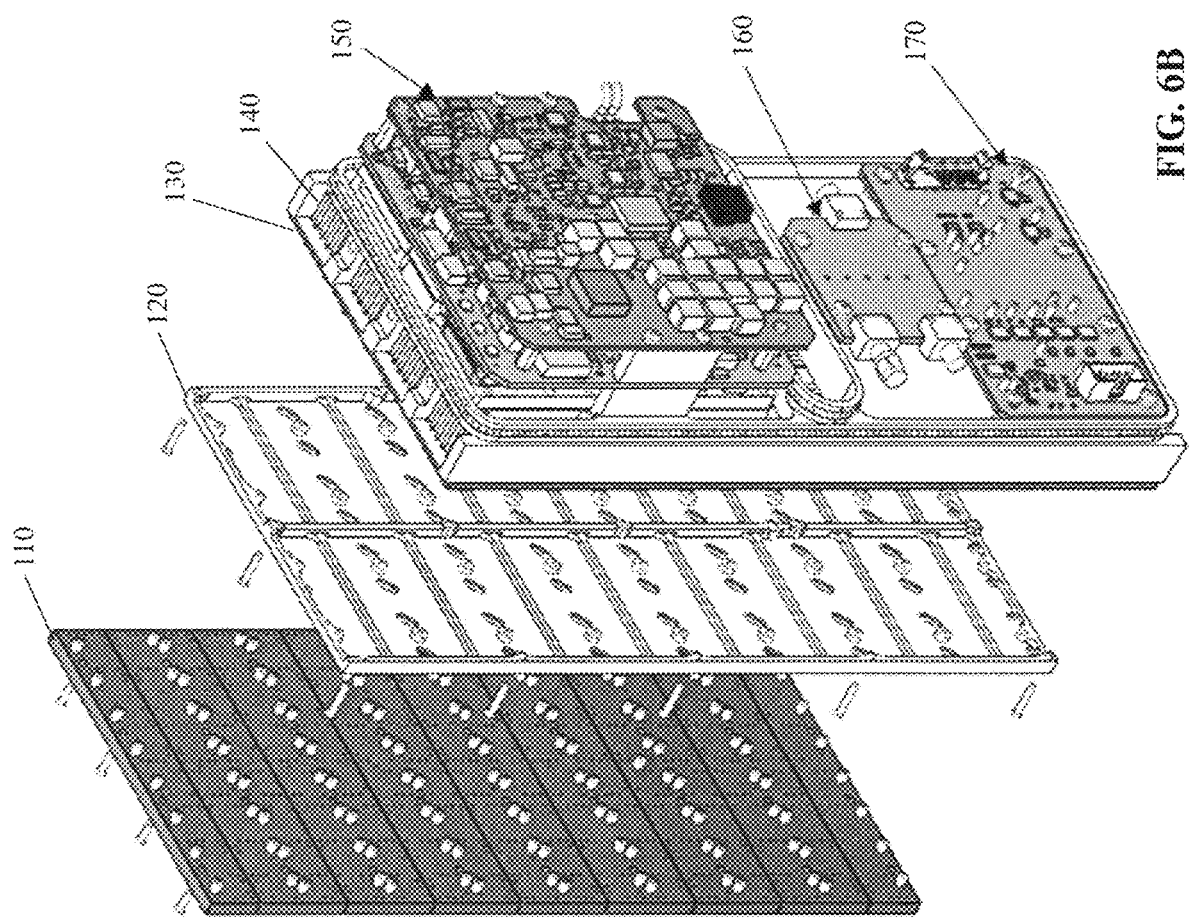

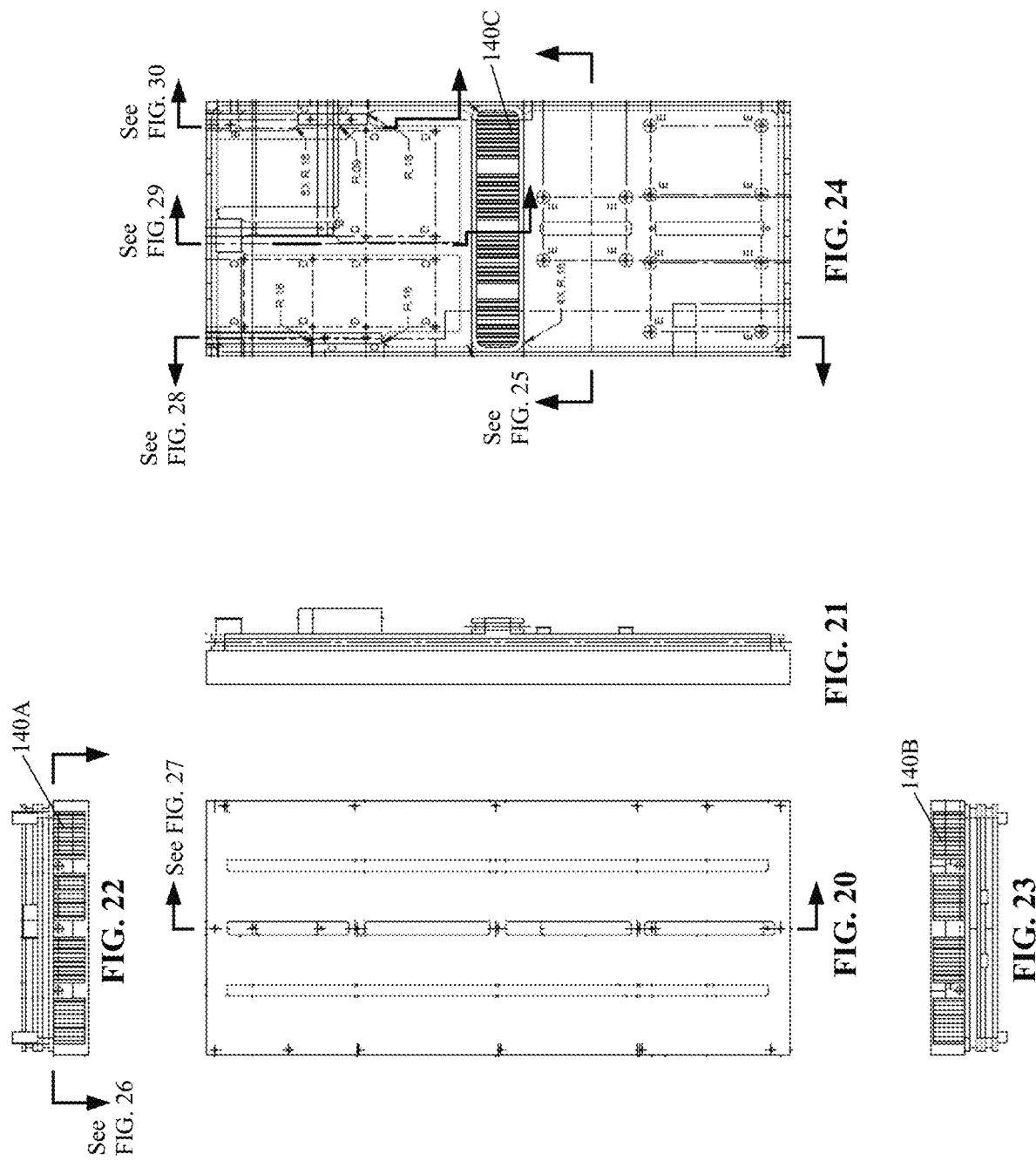

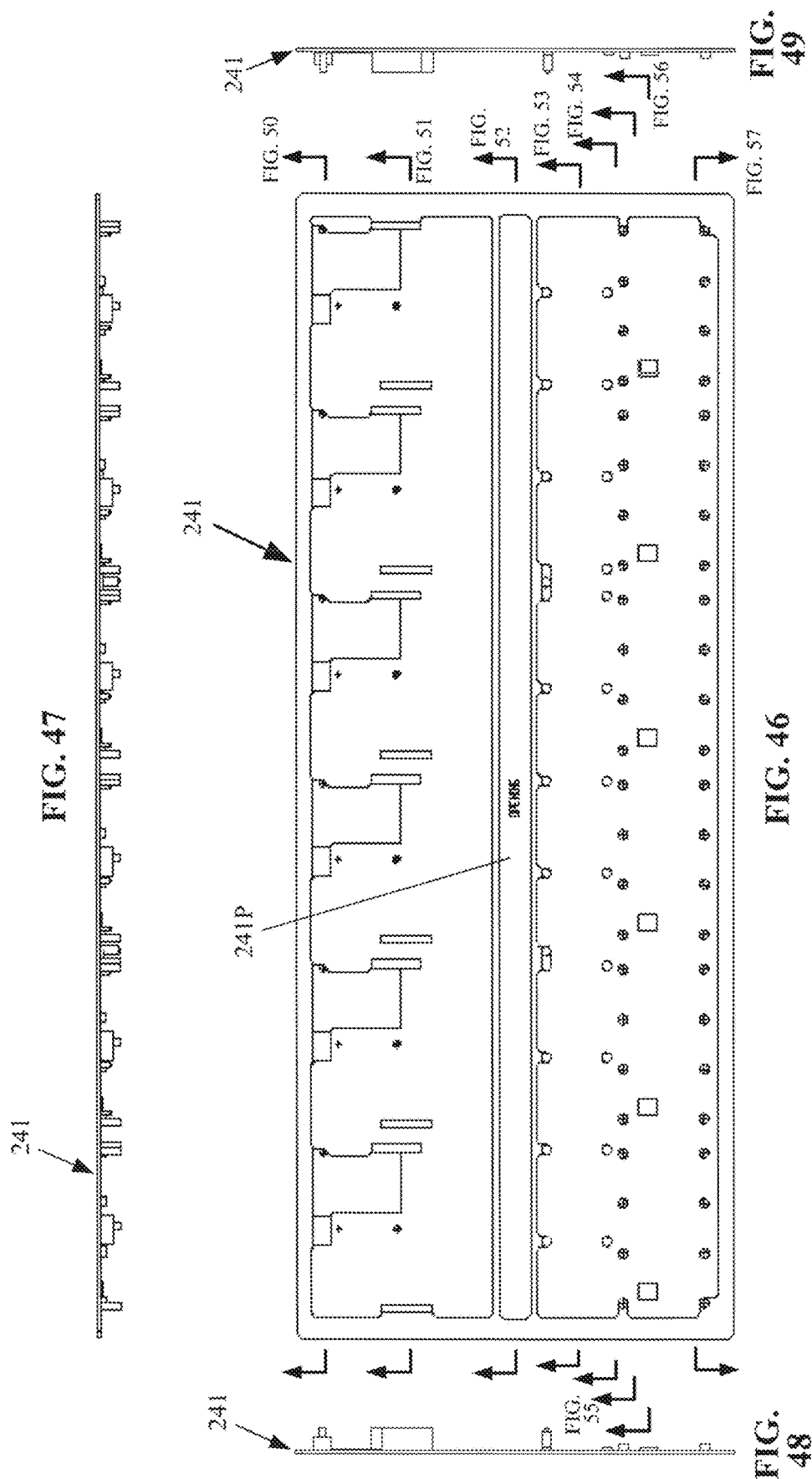

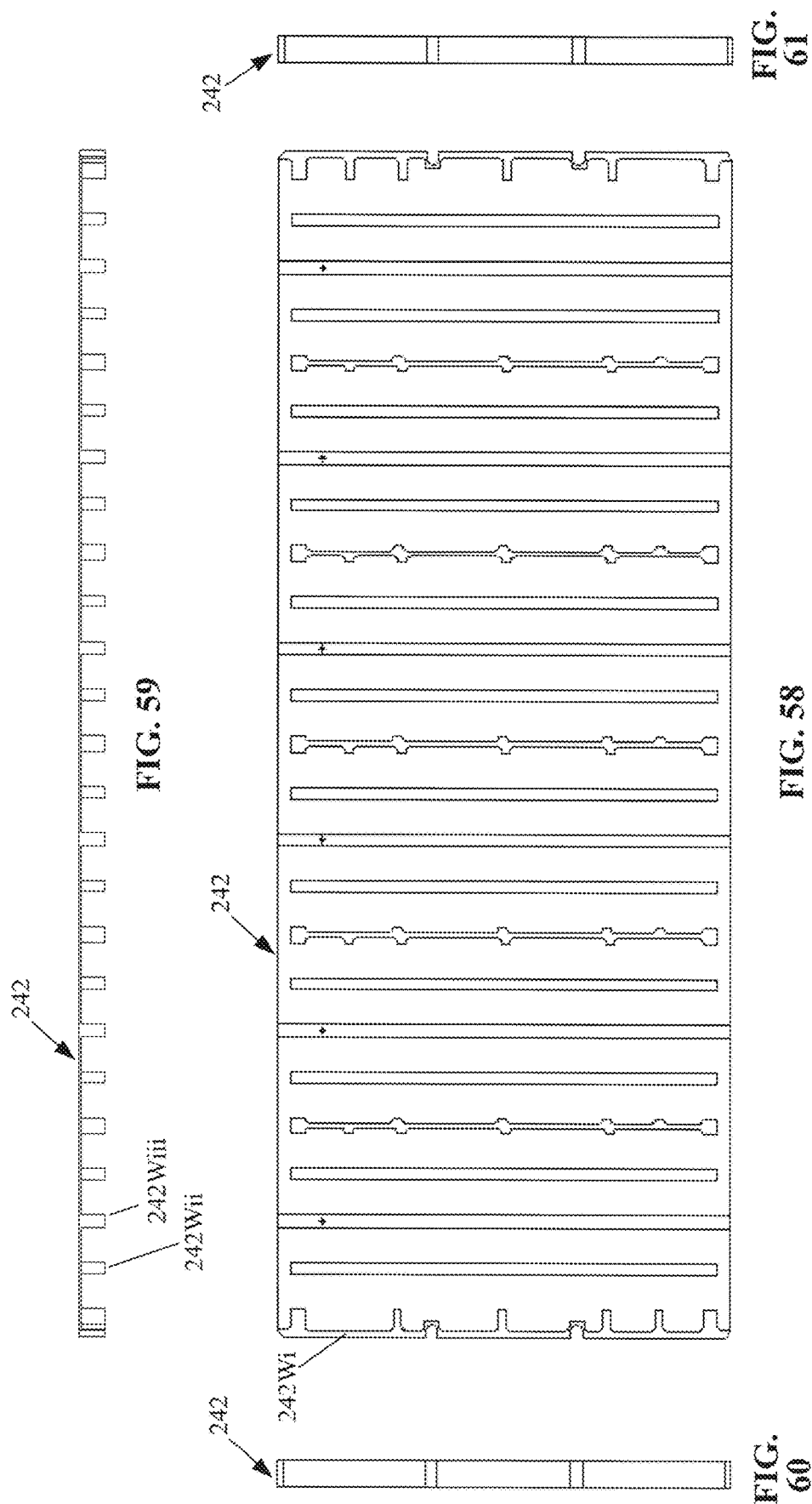

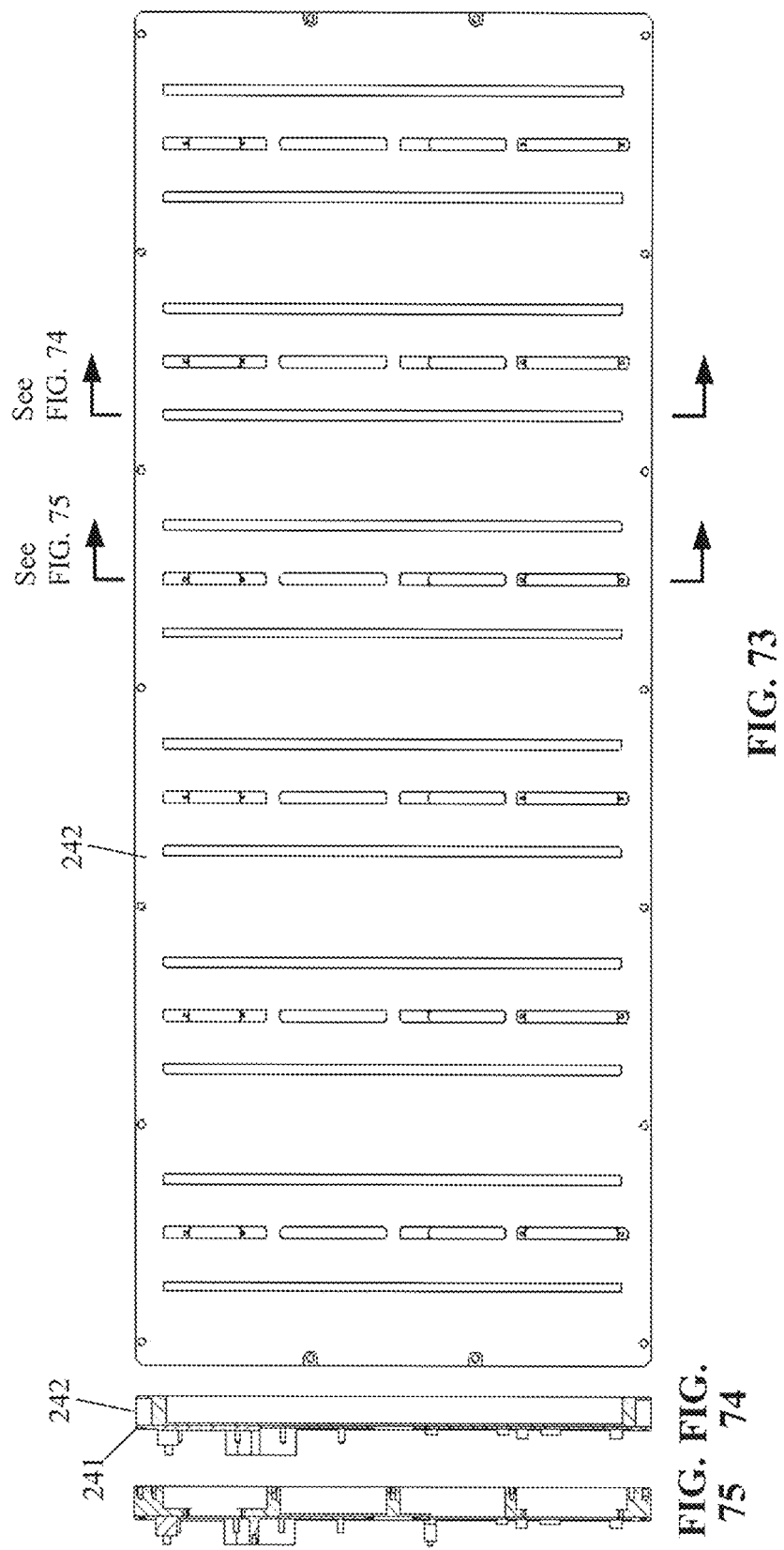

AIR-COOLED HEAT EXCHANGER AND THERMAL ARRANGEMENT FOR STACKED ELECTRONICS

CROSS REFERENCES TO RELATED APPLICATIONS

This application is a continuation in part of U.S. application Ser. No. 16/188,998, filed on Nov. 13, 2018, which claims priority on U.S. Provisional Application Ser. No. 62/585,019 filed on Nov. 13, 2017, all disclosures of which are incorporated herein by reference.

FIELD OF THE INVENTION

The disclosed apparatus relates to packaging and improved cooling of electronic components that includes a plurality of Monolithic Microwave Integrated Circuits (MMICs) for a radar antenna, and more particularly to a more efficient cooling arrangement in terms of size, weight, power and cost, that eliminates the need for a complex liquid cooled system to enable high ambient temperatures.

BACKGROUND OF THE INVENTION

Electronics packaging has become a major discipline within the field of electronic engineering. Some educational institutions, including the University of Maryland, offer graduate programs in electronics packaging. The American Society of Mechanical Engineers even publishes a Journal of Electronic Packaging. The packaging of modem electronics often must address multiple issues apart from the packaging envelope, including cooling adequacy, the potential for mechanical damage, radio frequency noise emission, protection from electrostatic discharge, accessibility and maintenance, cost, etc.

The demand for improved electronics packaging is very high in many areas, including many military applications where space and weight considerations are critical, particularly for aerospace vehicles.

The packaging of certain electronic systems is found in a number of U.S. Patents. For example, U.S. Pat. No. 4,631,636 to Andrews is for a high density packaging arrangement for electronics systems, where circuit board assemblies are provided with electronic components on one side and cooling tubes on the other side.

U.S. Pat. No. 4,841,355 to Parks is for a three-dimensional microelectronic package for semiconductor chips.

U.S. Pat. No. 5,181,167 to Davidson is for a stacking heatpipe for three dimensional electronic packaging.

U.S. Pat. No. 9,320,182 to Steger is for a modular liquid-cooled power semiconductor module.

The disclosed apparatus offers improvements upon prior art electronics packaging and heat transfer arrangements.

It is noted that citing herein of any patents, published patent applications and non-patent literature is not an admission as to any of those references constituting prior art with respect to the herein disclosed apparatus.

OBJECTS OF THE INVENTION

It is an object of the invention to provide an efficient cooling system for high power density electronics using an air-cooled heat exchanger, to eliminate the need for a complex liquid-cooled system to achieve a similar level of performance.

It is another object of the invention to provide a stacked and compact electronic packaging arrangement, including an array of patch antennas for an advanced radar system.

It is an object of the invention to provide a stacked electronic packaging arrangement that permits independent upgradability of active component boards and/or radiator boards, enabling changes in chip set and alternate polarizations with minimal hardware impact.

It is a further object of the invention to provide a heat exchanger with a reduced pressure drop using a shorter and/or more efficient air passage.

It is another object of the invention to provide a heat exchanger with an increased flow rate.

It is a further object of the invention to provide a heat exchanger that minimizes the temperature gradient across the baseplate of the heat exchanger.

It is an object of the invention to provide a stacked electronic packaging arrangement with a heat exchanger that creates a very uniform temperature gradient across all components within the electronic system.

It is yet another object of the invention to provide a heat exchanger with a reduced overall thickness to minimize the space utilized.

It is also an object of the invention to provide a combined dual flow heat exchanger that operates by taking in cooling air from opposite ends of the heat exchanger, and combining airflow in a middle exhaust outlet.

It is yet another object of the invention to provide a heat exchanger that uses higher density fin stock to improve cooling performance.

It is also an object of the invention to provide an improved heat exchanger and electronics arrangement that permits the use of smaller, less powerful, quieter fans.

It is yet another object of the invention to provide a stacked electronic packaging arrangement with improved system reliability and power handling capability.

It is also an object of the invention to provide a stacked electronic packaging arrangement with simplified serviceability and maintainability.

Further objects and advantages of the invention will become apparent from the following description and claims, and from the accompanying drawings.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with at least one embodiment of the disclosed apparatus, a stacked electronic packaging arrangement may be configured for independent upgradability of active component boards and radiator boards, enabling changes in chip set and alternate polarizations. The stacked electronic packaging arrangement may broadly include: an active tile circuit card assembly; a passive radiator circuit card assembly; a tile frame; and a heat exchanger.

The active tile circuit card assembly may be formed of a plurality of transmit/receive modules each configured to accept a radar signal comprising a first strength, to amplify the signal to a second strength, and to transmit the signal. The passive radiator circuit card assembly may include a plurality of patch radiators plugins each configured to receive the amplified signal from the transmit/receive modules of the active tile circuit card assembly, and to radiate the amplified signal into space. Each of the patch radiators plugins may be formed as a printed wiring board (PWB) stack-up of a plurality of RF materials and a cover comprising Kapton. A plurality of blind mating male and female RF connectors may be mounted to the passive radiator circuit card assembly and to the active tile circuit card assembly, respectively, and may be used, when coupled together, to transmit the amplified signal therebetween.

The tile frame may be configured to provide separation between the active tile circuit card assembly and the passive radiator circuit card assembly; therefore the main thickness of the tile frame may preferably be at least as thick as a height of the male and female RF connectors when coupled together. A first side of the tile frame may be mounted against a first side of the heat exchanger, and a first side of the passive radiator circuit card assembly may be mounted against a second side of the tile frame. Flush screws, bolts, or any other suitable mechanical fasteners, such as one-quarter turn quick release fasteners may be used for securing the passive radiator circuit card assembly and the tile frame to the heat exchanger. See e.g., U.S. Pat. No. 3,145,441 to Strandrud; U.S. Pat. No. 3,474,506 to Metz; U.S. Pat. No. 5,517,734 to Korpi; U.S. Pat. No. 5,978,233 to Roscoe; U.S. Pat. No. 6,752,562 to Mills; U.S. Pat. No. 6,786,669 to Tsui; and U.S. Pat. No. 7,736,109 to Schmier.

The stacked electronic packaging arrangement may also include other boards that may be mounted to the second side of the heat exchanger. For example, a tile power converter board may be mounted to the second side of the heat exchanger, and the board may have electrical components on both a first side and a second side thereof. A plurality of standoffs formed of a material comprising a high thermal conductivity may be mounted to, or integrally formed with, the housing of the second side of the heat exchanger, and the tile power converter board may be mounted to the standoffs and secured to the heat exchanger using any suitable fasteners, as discussed hereinabove.

The heat exchanger is air-cooled heat, but is particularly constructed to have a reduced pressure drop using a shorter and/or more efficient air passage, which permits an increased flow rate and minimizes the temperature gradient across the baseplate of the heat exchanger, so the heat exchanger creates a very uniform temperature gradient across all components within the electronic system. Therefore, the efficiency and effectiveness of the heat exchanger eliminates the need for a complex liquid-cooled system to achieve a similar level of performance.

The heat exchanger may include an elongated casing/housing which may be a multi-piece arrangement, and which may create an accommodating space for the air flow, and which may form a first air inlet into the accommodating space, a second air inlet into the accommodating space, and a centrally positioned exhaust plenum positioned between the first air inlet and the second air inlet. In one embodiment, the heat exchanger may have a first plurality of high density fins positioned within the accommodating space between the first air inlet and the exhaust outlet to define a first flow path; and a second plurality of high density fins positioned within the accommodating space between the second air inlet and the exhaust outlet to define a second flow path, where second flow path is separated from the first flow path, and wherein a direction of the first flow path between the first air inlet and the exhaust is opposite to a direction of the second flow path between the first air inlet and the exhaust. In another embodiment, a single plurality of high density fins may span between the first air inlet and the second air inlet, and may have openings proximate to the exhaust outlet. Flow may be diverted out from the openings in the fins at the exhaust plenum using a diverter. A single fan or multiple fans may be used to drive air into each of the first air inlet and the second air inlet. The first air inlet is preferably positioned proximate to a first end of the elongated casing, and the second air inlet is preferably positioned proximate to a second end of the elongated casing.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The description of the various example embodiments is explained in conjunction with appended drawings, in which:

FIG. 3 is a side view of the stacked electronics package of FIG. 1;

FIG. 4 is an enlarged top view of the stacked electronics package of FIG. 1;

FIG. 6B is a second exploded perspective view of the component parts of the stacked electronics package of FIG. 1, showing a second side of the parts;

FIG. 20 is a front view of the heat exchanger of FIG. 16;

FIG. 21 is a side view of the heat exchanger of FIG. 16;

FIG. 22 is a top view of the heat exchanger of FIG. 16;

FIG. 23 is a bottom view of the heat exchanger of FIG. 16;

FIG. 24 is a rear view of the heat exchanger of FIG. 16;

FIG. 36A is a cross-sectional view through a stacked electronics package in accordance with one or more embodiments disclosed herein, showing a flow path from the inlets and through the heat exchanger, and out the heat exchanger outlet, through a conduit past a fan, with the flow exiting at an exterior portion of the side of the stacked electronics package;

FIG. 46 is a front view of the rear housing plate of the multi-sectional heat exchanger assembly shown in FIG. 43;

FIG. 47 is a top view of the rear housing plate shown in FIG. 46;

FIG. 48 is a left side view of the rear housing plate shown in FIG. 46;

FIG. 49 is a right side view of the rear housing plate shown in FIG. 46;

FIG. 58 is a front view of the front housing plate of the multi-sectional heat exchanger assembly shown in FIG. 43;

FIG. 59 is a top view of the front housing plate shown in FIG. 58;

FIG. 60 is a left side view of the front housing plate shown in FIG. 58;

FIG. 61 is a right side view of the front housing plate shown in FIG. 58;

FIG. 73 is a rear view of the assembled front housing plate, rear housing plate, and high density fin sections, as shown in FIG. 70;

FIG. 74 is a first section cut through the assembled front housing plate, rear housing plate, and high density fin sections of FIG. 70; and FIG. 75 is a second section cut through the assembled front housing plate, rear housing plate, and high density fin sections of FIG. 70.

DETAILED DESCRIPTION OF THE INVENTION

Figure 2:
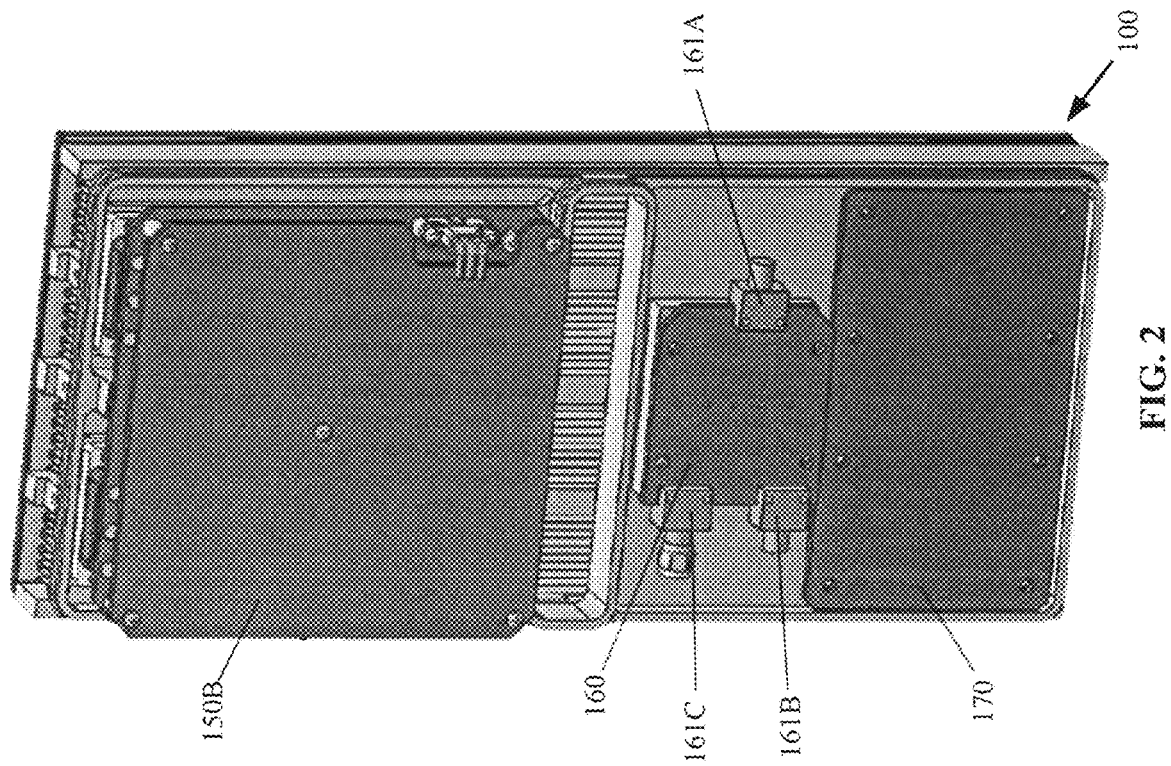
FIG. 2 illustrates a rear perspective view of the stacked electronics package shown in FIG. 1.

As used throughout this specification, the word "may" is used in a permissive sense (i.e., meaning having the potential to), rather than a mandatory sense (i.e., meaning must), as more than one embodiment of the invention may be disclosed herein. Similarly, the words "include", "including", and "includes" mean including but not limited to.

The phrases "at least one". "one or more", and "and/or" may be open-ended expressions that are both conjunctive and disjunctive in operation. For example, each of the expressions "at least one of A, B and C", "one or more of A, B, and C", and "A, B, and/or C" herein means all of the following possible combinations: A alone; or B alone; or C alone; or A and B together; or A and C together; or B and C together; or A, B and C together.

Also, the disclosures of all patents, published patent applications, and non-patent literature cited within this document are incorporated herein in their entirety by reference. However, it is noted that citing herein of any patents, published patent applications, and non-patent literature is not an admission as to any of those references constituting prior art with respect to the disclosed apparatus.

Furthermore, the described features, advantages, and characteristics of any particular embodiment disclosed herein, may be combined in any suitable manner with any of the other embodiments disclosed herein.

Additionally, any approximating language, as used herein throughout the specification and claims, may be applied to modify any quantitative or qualitative representation that could permissibly vary without resulting in a change in the basic function to which it is related. Accordingly, a value modified by a term such as "about" is not to be limited to the precise value specified, and may include values that differ from the specified value in accordance with applicable case law. Also, in at least some instances, a numerical difference provided by the approximating language may correspond to the precision of an instrument that may be used for measuring the value. A numerical difference provided by the approximating language may also correspond to a manufacturing tolerance associated with production of the aspect/feature being quantified. Furthermore, a numerical difference provided by the approximating language may also correspond to an overall tolerance for the aspect/feature that may be derived from variations resulting from a stack up (i.e., the sum) of multiple individual tolerances.

Any use of a friction fit (i.e., an interface fit) between two mating parts described herein may be a slight interference in one embodiment in the range of 0.0025 mm to 0.0076 mm (0.0001 inches to 0.0003 inches), or an interference of 0.0076 mm to 0.0178 mm (0.0003 inches to 0.0007 inches) in another embodiment, or an interference of 0.0178 mm to 0.0254 mm (0.0007 inches to 0.0010 inches) in yet another embodiment, or a combination of such ranges. Other values for the interference may also be used in different configurations (see e.g., "Press Fit Engineering and Design Calculator," available at: www.engineersedge.com/calculators/machine-design/press-fit/press-fit-calculator.htm).

It is further noted that any use herein of relative terms such as "top," "bottom," "upper," "lower," "vertical," and "horizontal" are merely intended to be descriptive for the reader, based on the depiction of those features within the figures for one particular position of the device, and such terms are not intended to limit the orientation with which the device of the disclosed apparatus may be utilized.

FIGS. 1-4 illustrate perspective, side, and top views of a first embodiment of a stacked electronics package 100, and FIGS. 6A-8 illustrate exploded views of the component parts of that stacked electronics package. As seen therein, the stacked electronics package 100 may include a passive radiator circuit card assembly 110, a tile frame 120, an active tile circuit card assembly 130, a heat exchanger 140, a tile power converter 150, a tile combiner 160, and a tile controller circuit card assembly 170. Each circuit card assembly (CCA) herein may include a printed circuit board populated with electronic components that may include millimeter monolithic integrated circuits (MIMICs).

Figure 1:
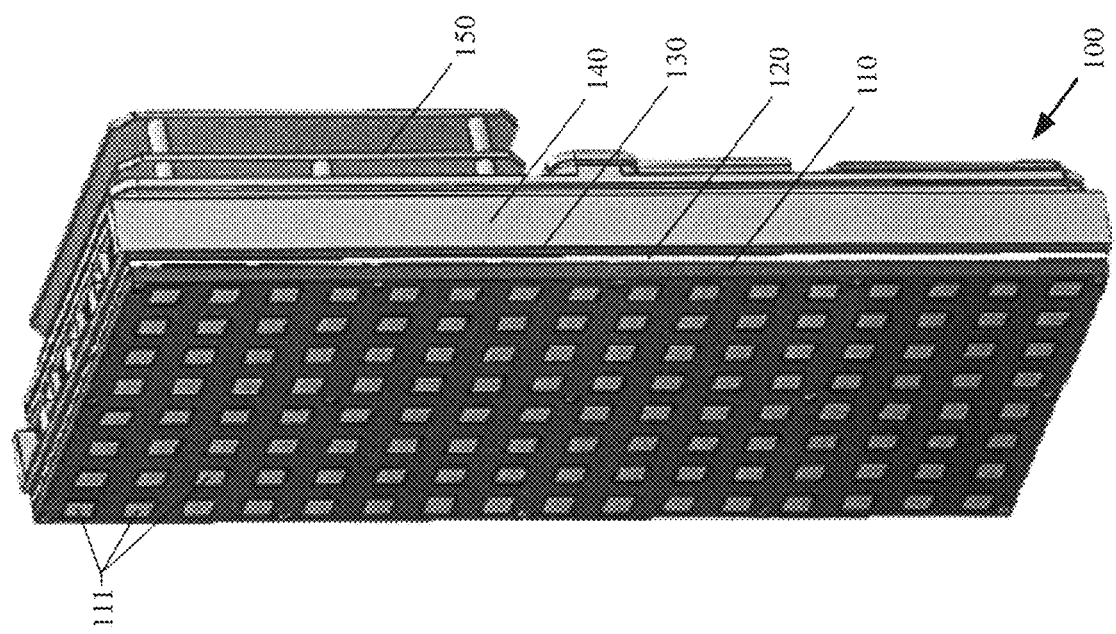
FIG. 1 illustrates a front perspective view in accordance with of a first embodiment of the herein disclosed stacked electronics package.
Figure 6A:
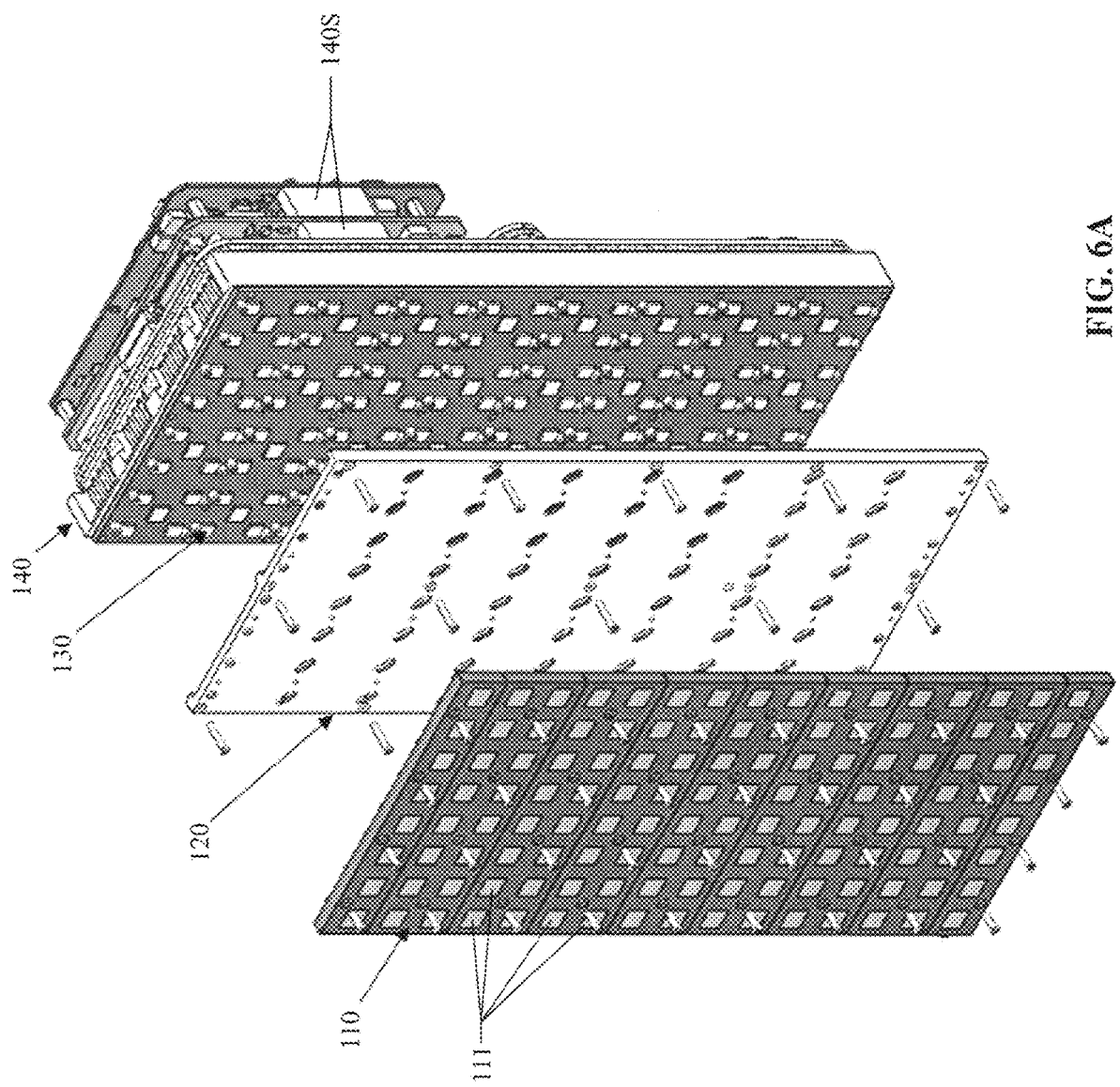
FIG. 6A illustrates a first exploded perspective view of the component parts of the stacked electronics package of FIG. 1, showing a first side of the parts.
Figure 7:
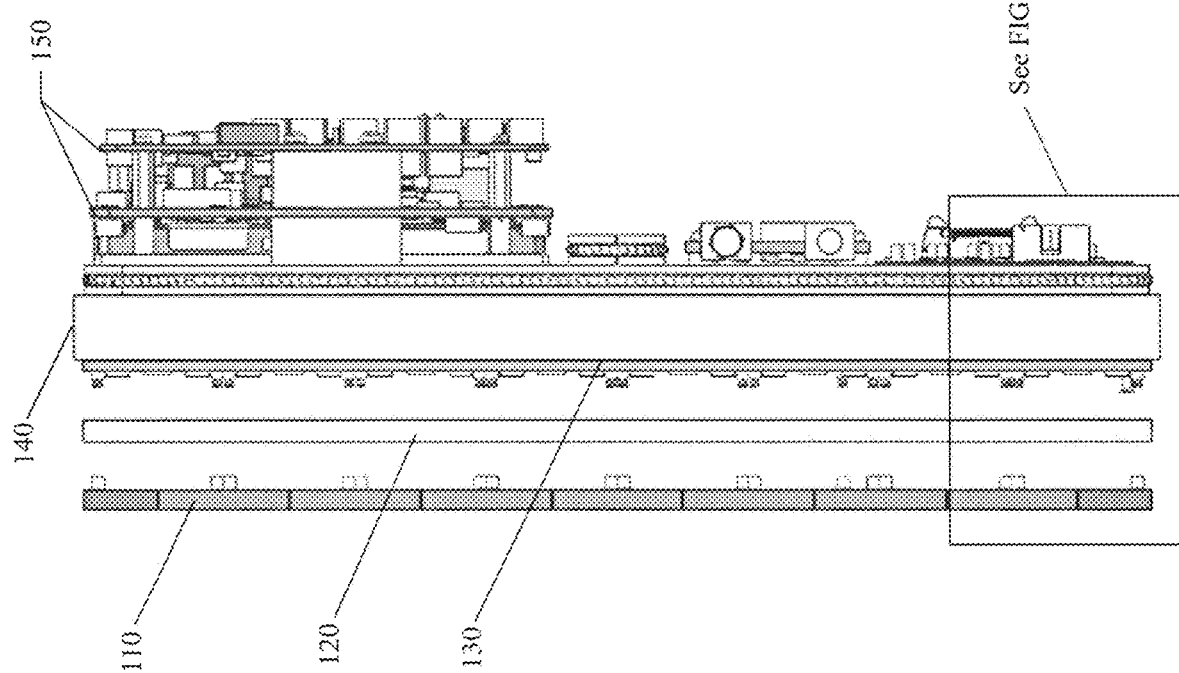
FIG. 7 is an exploded side view of the component parts of the stacked electronics package of FIG. 1.
Figure 10:
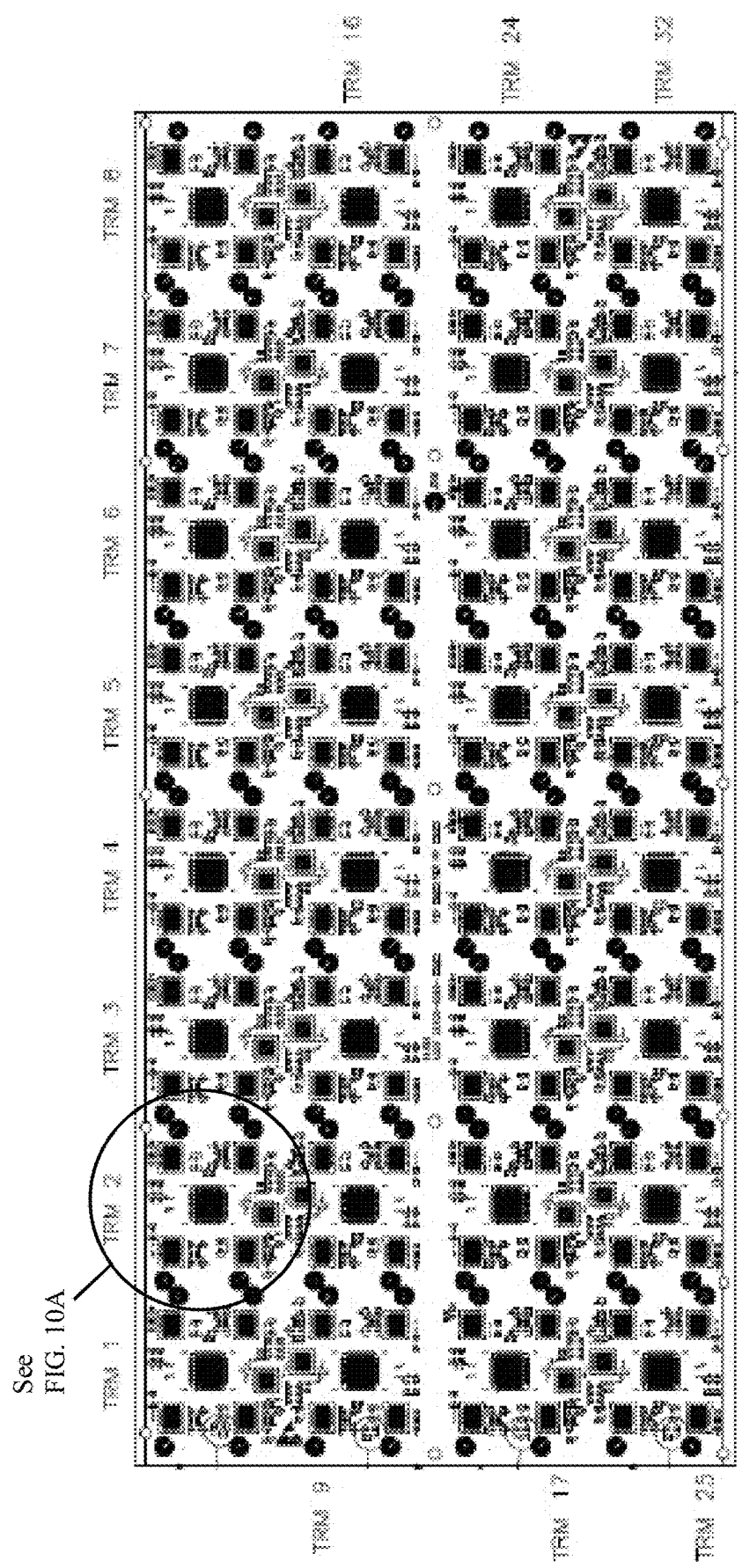
FIG. 10 illustrates the primary side of the active tile circuit card assembly (CCA) shown in FIG. 1.

The passive radiator circuit card assembly 110 may be formed, in one embodiment, of a plurality of radiating elements 111 (e.g., patch radiators plugins) that may be imprinted into the inner board layers. Each radiator plug-in may be formed of a printed wiring board (PWB) stack-up of various RF materials (e.g., RO3003™ laminates made by the Rogers Corp. and a high K (dielectric constant) layer with a thin covering made of Kapton-poly (4,4'-oxydiphenylene-pyromellitimide)). In one embodiment of the radiator circuit card assembly 110 there may be 128 radiating elements 111, as shown in FIG. 1 and FIG. 6A. The radiating elements 111 are constructed to accept energy from the transmit/receive modules shown in FIG. 10, and to radiate the energy into space as efficiently as possible. The 128 radiators may be used as an antenna, and may be suitable for a radar antenna, and may also serve several other functions. One embodiment of a plug-in radiator module that may be used to form the radiator circuit card assembly is shown in FIGS. 11-14.

Figure 9:
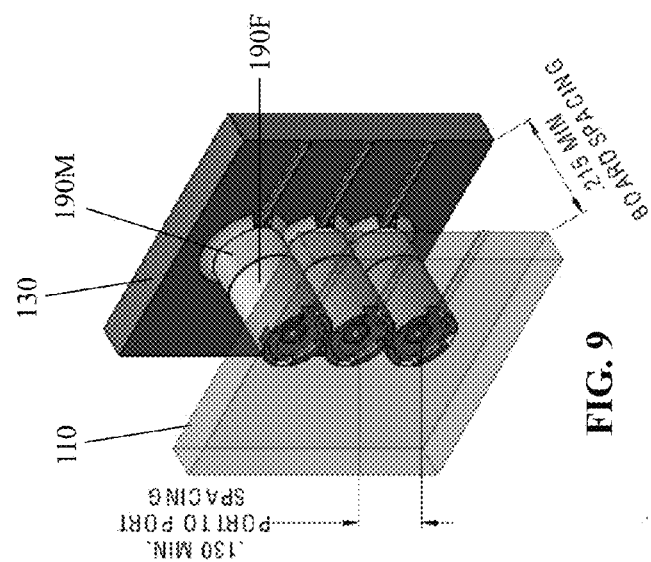
FIG. 9 illustrates a series of male and female RF connectors for the radiator circuit card assembly (CCA) and the active tile circuit card assembly shown in FIG. 8, after being mated together.
Figure 8:
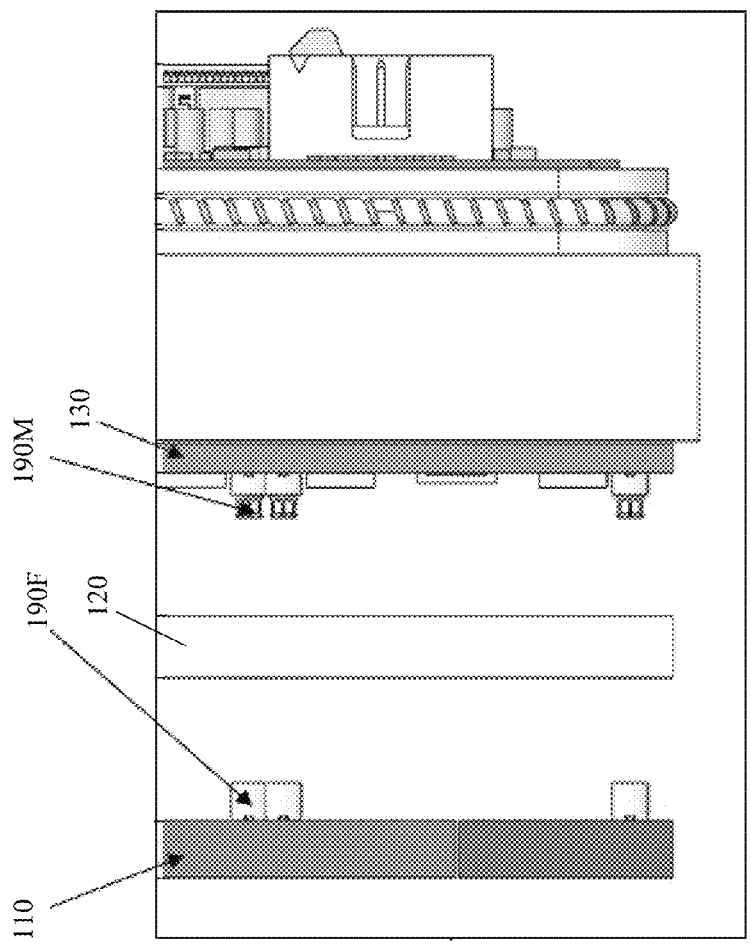
FIG. 8 is an enlarged detail view of the bottom of the parts shown in the exploded view of FIG. 7.

The radiator circuit card assembly 110 may plug directly into the active tile circuit card assembly board 130 using a plurality of blind mating, low insertion force, male and female RF connectors 190M/190F, as seen in FIG. 8 and FIG. 9, which male and female RF connectors may be respectively mounted to each board, and may be electrically coupled to the radiator elements. The radiator circuit card assembly 110 may be separated from the tile circuit card assembly board 130 by the tile frame 120, which in one embodiment may have a minimum thickness of 5.46 mm (0.215 inches) (see FIG. 9), which may, in one embodiment, correspond to the height of the joined male and female RF connectors 190M/190F.

This construction is distinct from other approaches utilized in the industry, which integrate the active devices with the radiators on opposite sides of the same board, which is at the expense of decreased thermal effectiveness/heat sinking. The arrangement of the stacked electronics package 100 instead allows optimization of the thermal performance (vs. RF performance), thus allowing air-cooling instead of liquid cooling to be used for relatively high power transmit/receive (TRM) modules (i.e., typical power density of 100 W/in$^2$ for a 40° C. temperature differential).

Figure 5:
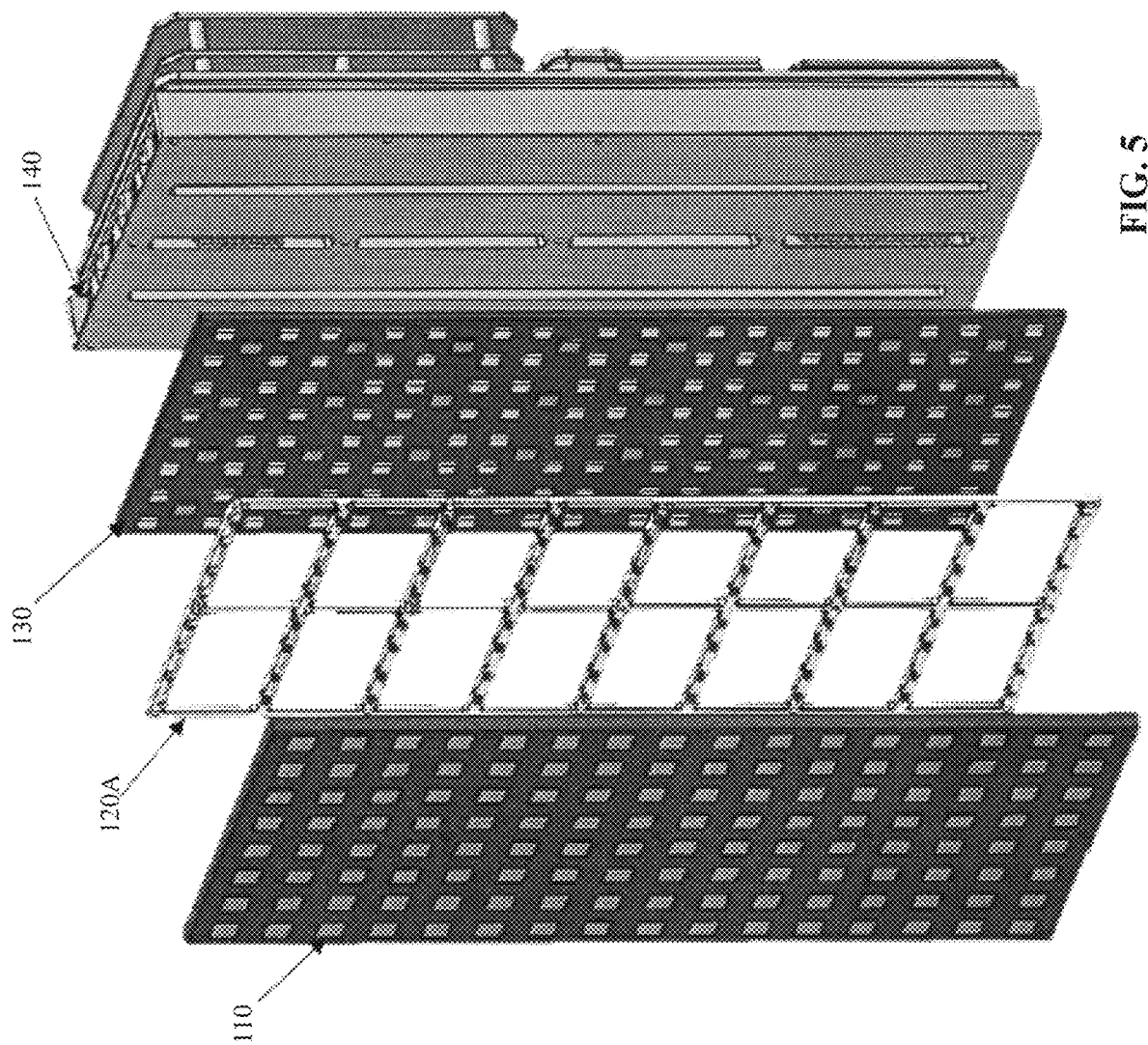
FIG. 5 illustrates an exploded view of the component parts for an alternate embodiment of the stacked electronics package shown in FIG. 1, which includes an alternate embodiment of the tile frame of FIG. 1 that is positioned between the radiator circuit card assembly on the leftmost side and the active tile circuit card assembly.
Figure 15B:
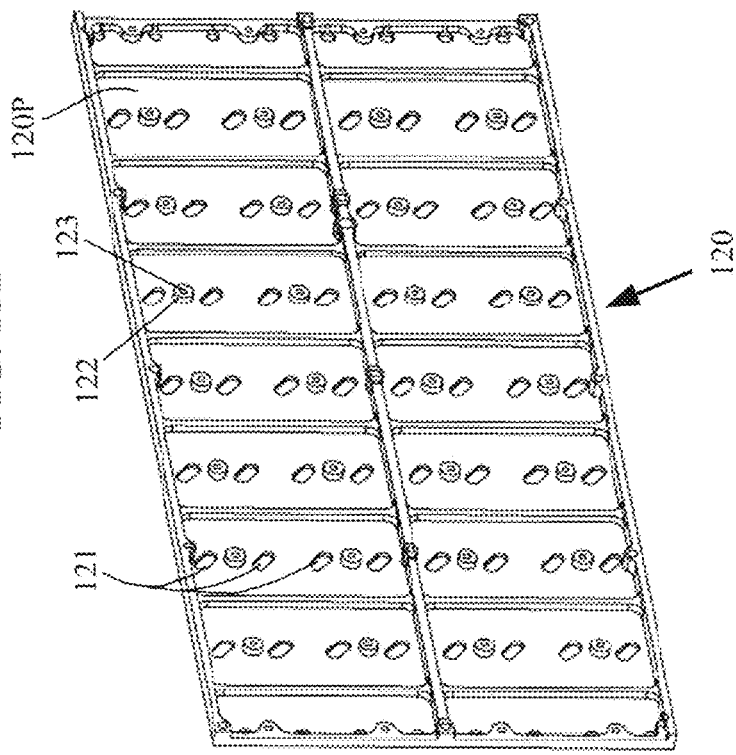
FIG. 15B is a rear perspective view of the tile frame of FIG. 15A.
Figure 15A:
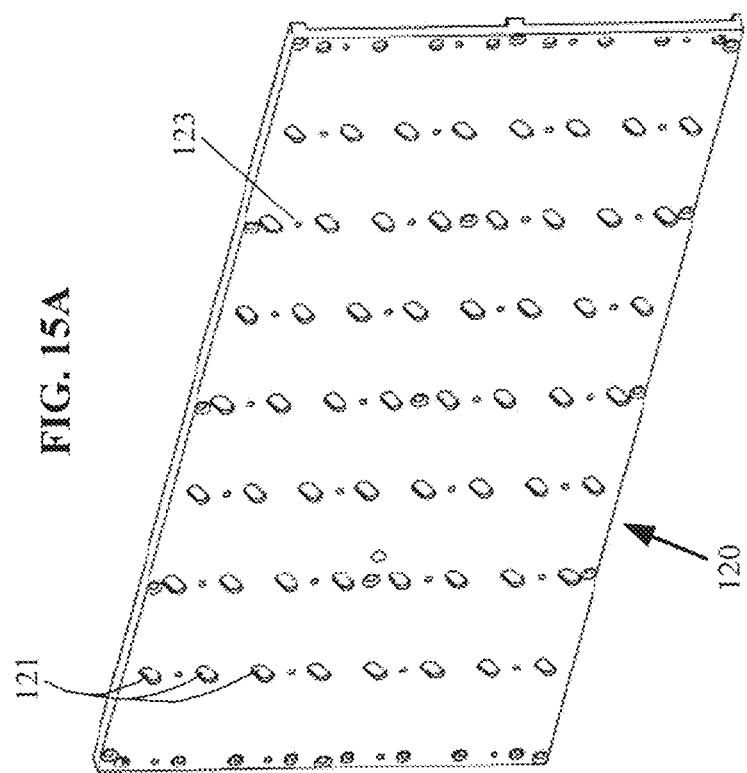
FIG. 15A is a front perspective view of the tile frame shown in FIG. 1A and FIG. 1B.

The tile frame 120 is shown in detail in FIGS. 15A and 15B, and may provide for separation (i.e., spacing) between the radiator CCA 110 and the active tile CCA 130. One side of the tile frame 120 may be substantially flat, and the other side may have a series of pockets 120P formed therein, which may provide weight savings for the overall assembly. A plurality of slotted through-openings 121 may be formed in the tile frame 120, each of which may be particularly positioned to respectively accommodate the plurality of RF connectors 190M/190F (i.e., to permit the male and female connectors to pass through the tile frame and mate with each other). A plurality of bosses 122 may be formed within the pockets, each of which may have a through hole for a fastener. (Note—for the tile frame 120A shown in FIG. 5, which may be used for an alternate embodiment of the stacked electronics package, the pockets may be replaced by larger through-openings). The separation provided by the pocketed tile frame 120 between the radiator circuit card assembly 110 and the active tile circuit card assembly board 130 may also tend to insulate the radiator circuit card assembly from the large quantity of heat produced by the active tile circuit card assembly. The tile frame 120 may be made of any suitable material, including, but not limited to, any suitable metallic material, wood, plastic, composite materials, etc. In one embodiment, the tile frame 120 may be made of aluminum, and may be the alloy 6061-T6.

Screws or other mechanical fasteners may be used to secure the tile frame 120 to the heat exchanger 140, as shown in FIG. 6B, and which screws may also go through, and support, the active tile CCA 130 with respect to the heat exchanger. The active tile CCA 130 may thus be mounted directly onto the heat exchanger 140 providing the most direct thermal path from the high power SiGe (silicon germanium) and GaN (gallium nitride) devices positioned thereon to the cold wall. The radiator CCA 110 may additionally/alternatively be mechanically secured to the tile CCA 130 using screws or other mechanical fasteners. This arrangement permits independent upgradability of the active components board (i.e. replacement of the tile CCA 130) and/or upgrading of the passive radiator board (i.e. replacement of the radiator CCA 110), enabling changes in chipset and alternate polarizations with minimal hardware impact.

Figure 10A:
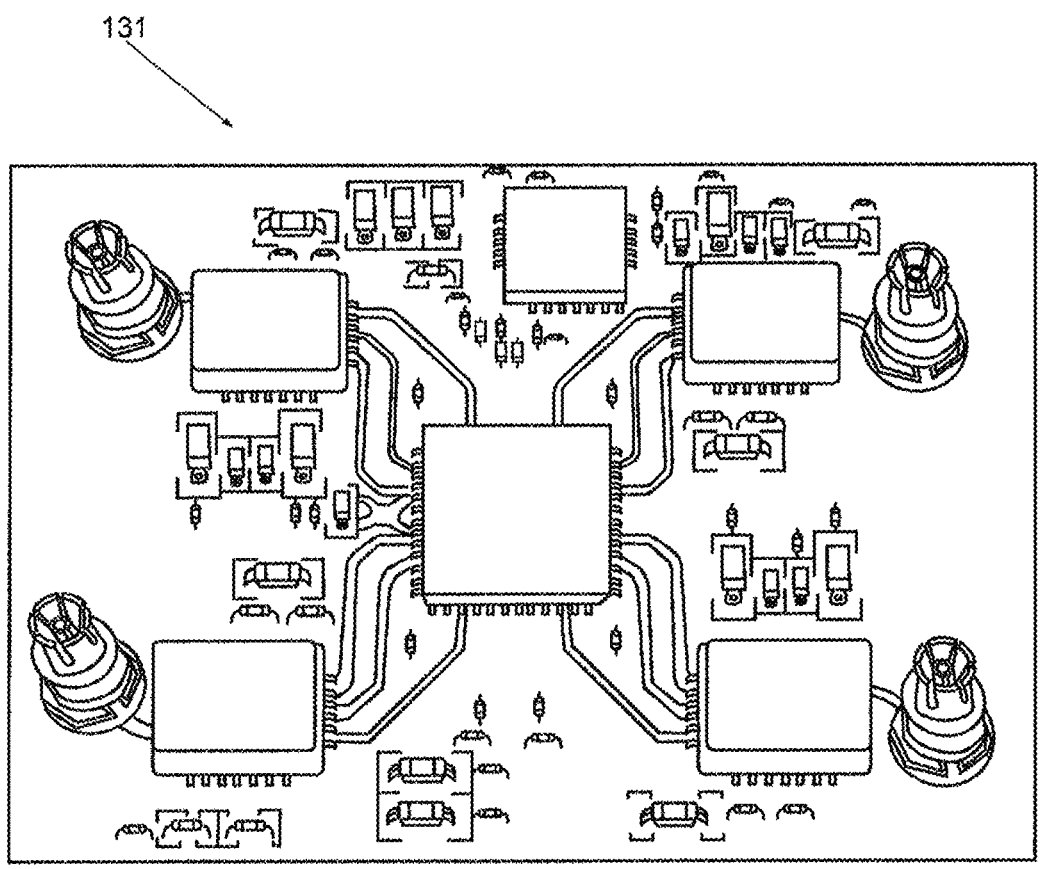
FIG. 10A is a detail view showing the component placement for one transmit module used on the primary side of the active tile circuit card assembly of FIG. 10.
Figure 11:
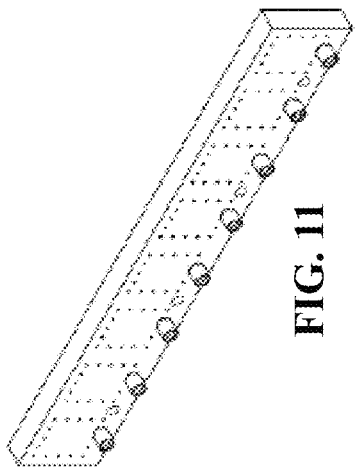
FIG. 11 is a perspective view of a plug-in radiator module, a plurality of which may be used to form the radiator circuit card assembly.
Figure 12:
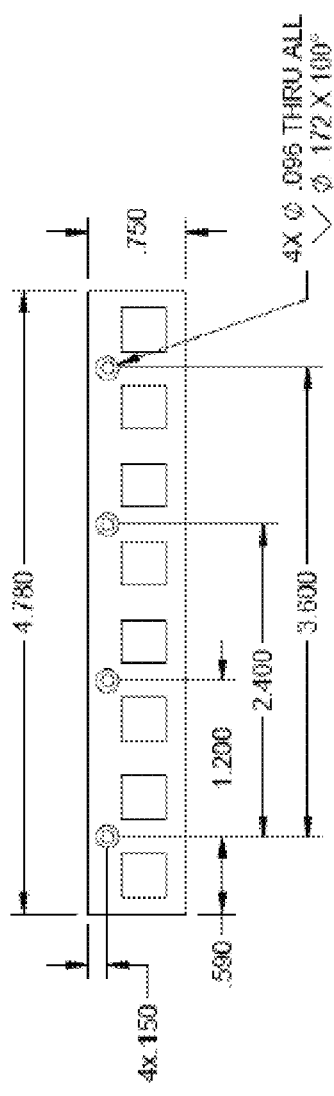
FIG. 12 is a rear view of the plug-in radiator module of FIG. 11.
Figure 13:
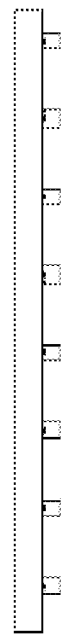
FIG. 13 is a top view of the plug-in radiator module of FIG. 11.
Figure 14:
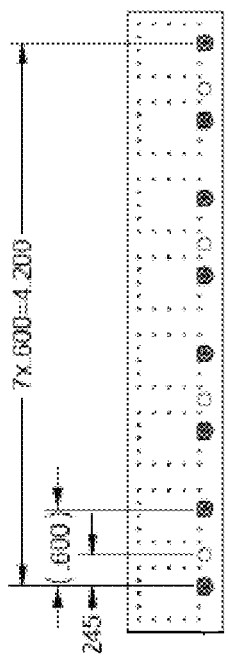
FIG. 14 is a front view of the plug-in radiator module of FIG. 11.

The active tile CCA 130 may be formed of a plurality of transmit/receive modules 131, which are shown in detail in FIG. 10A. In one embodiment, the active tile CCA 130 may be formed of 32 of the transmit/receive modules 131. The transmit/receive modules 131 are configured to accept a low level radar signal, provide amplification, radiate, and ultimately receive radar returns which radar returns may be processed downstream into radar images, etc.

Each transmit/receive module 131 of the active tile CCA 130 may have the MIMICS necessary to support the four transmission elements, i.e., the four low insertion force RF connectors.

On the opposite side of the heat exchanger 140 may be mounted the tile power converter boards 150, the tile combiner 160, and the tile controller CCA 170. The tile power converter boards 150 may have components on both sides of the boards (see FIG. 4), and may therefore be mounted to the heat exchanger 140 using standoffs 140S that may be formed of a material configured to act as a heat sink, i.e., having a high thermal conductivity value. Thermal conductivity is the quantity of heat that passes in a unit time through a plate of particular area and thickness when its opposite faces differ in temperature by one degree kelvin. For a plate of thermal conductivity k, area A and thickness L, the conductance calculated is kA/L, which is measured in W/° K (see also, ASTM C168-15). An example of a material with a high thermal conductivity is pure copper, which generally has a thermal conductivity in the range of 385 W/(m)(K) to 390 W/(m)(K) at a temperature of 293 degrees Kelvin/67.7 degrees Fahrenheit (i.e., "room" temperature). Pure zinc has a thermal conductivity of 115 W/(m)(K) at a temperature of 293 degrees Kelvin. Fiberglass, which is often used for insulation, generally has a thermal conductivity of about 0.045 W/(m)(K) at a temperature of 293 degrees Kelvin. Therefore, as used herein, a material with a high thermal conductivity is a material that preferably has a thermal conductivity of at least 75 W/(m)(K), and more preferably has a thermal conductivity of at least 150 W/(m)(K), and most preferably has a thermal conductivity of at least 250 W/(m)(K).

The tile combiner 160 may be coupled to the heat exchanger 140 using RF output connectors 161A, 161B, and 161C.

Figure 16:
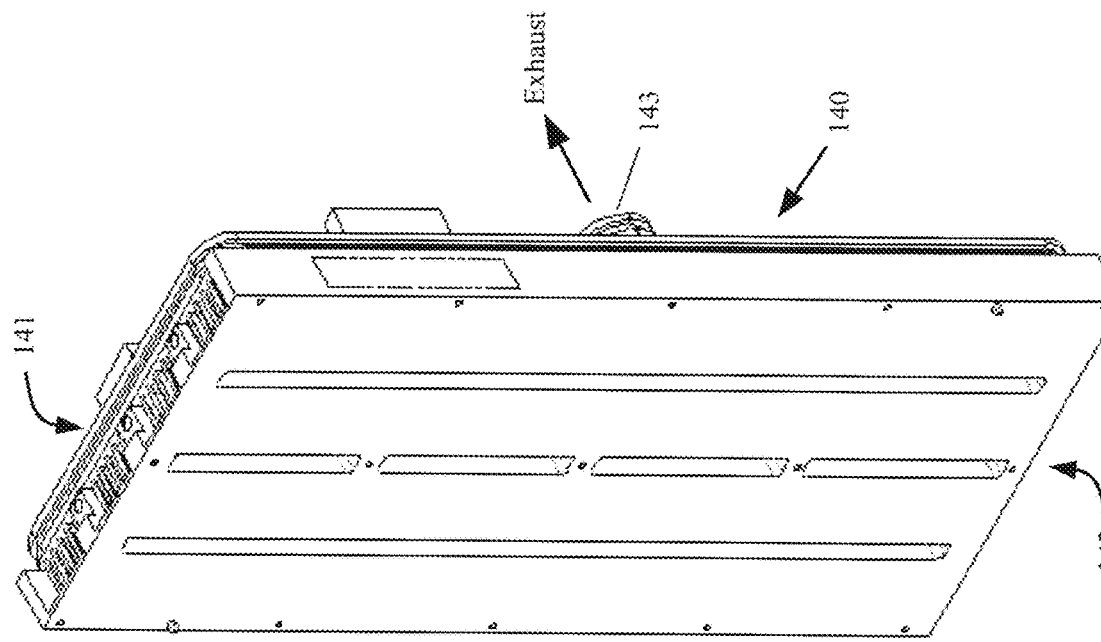
FIG. 16 is a front perspective view of the heat exchanger with integral heat sinks, as shown in FIG. 1A and FIG. 1B.
Figure 17:
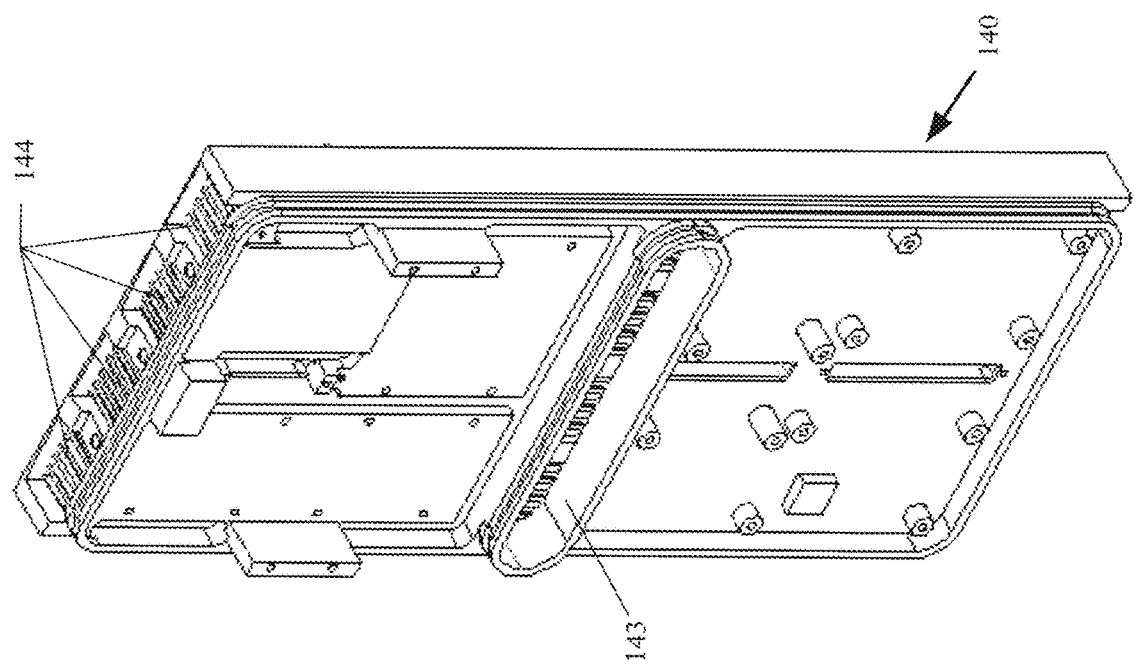
FIG. 17 is a rear perspective view of the heat exchanger of FIG. 16.
Figure 18:
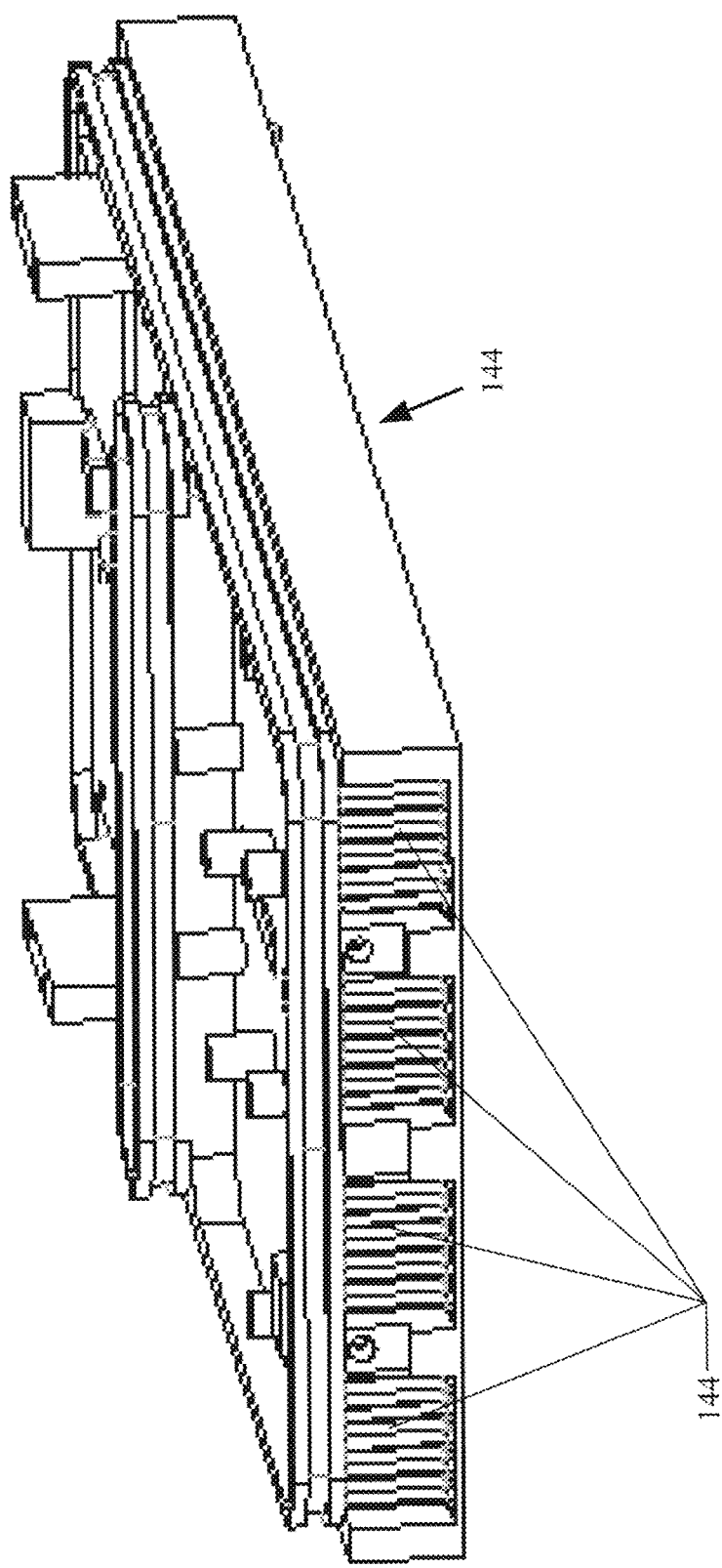
FIG. 18 is an end perspective view of the heat exchanger of FIG. 16.
Figure 19:
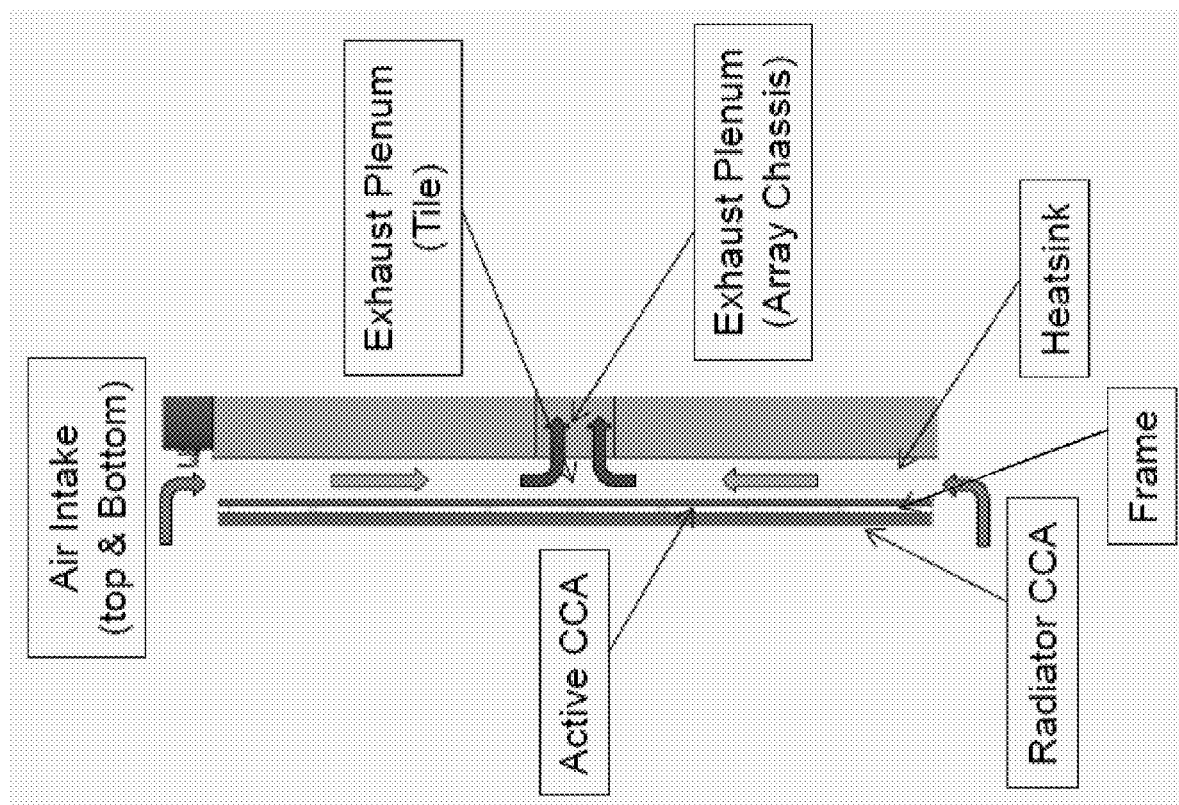
FIG. 19 is a diagram illustrating the bi-directional flow path of air through the heat exchanger of FIGS. 16-18.
Figure 20A:
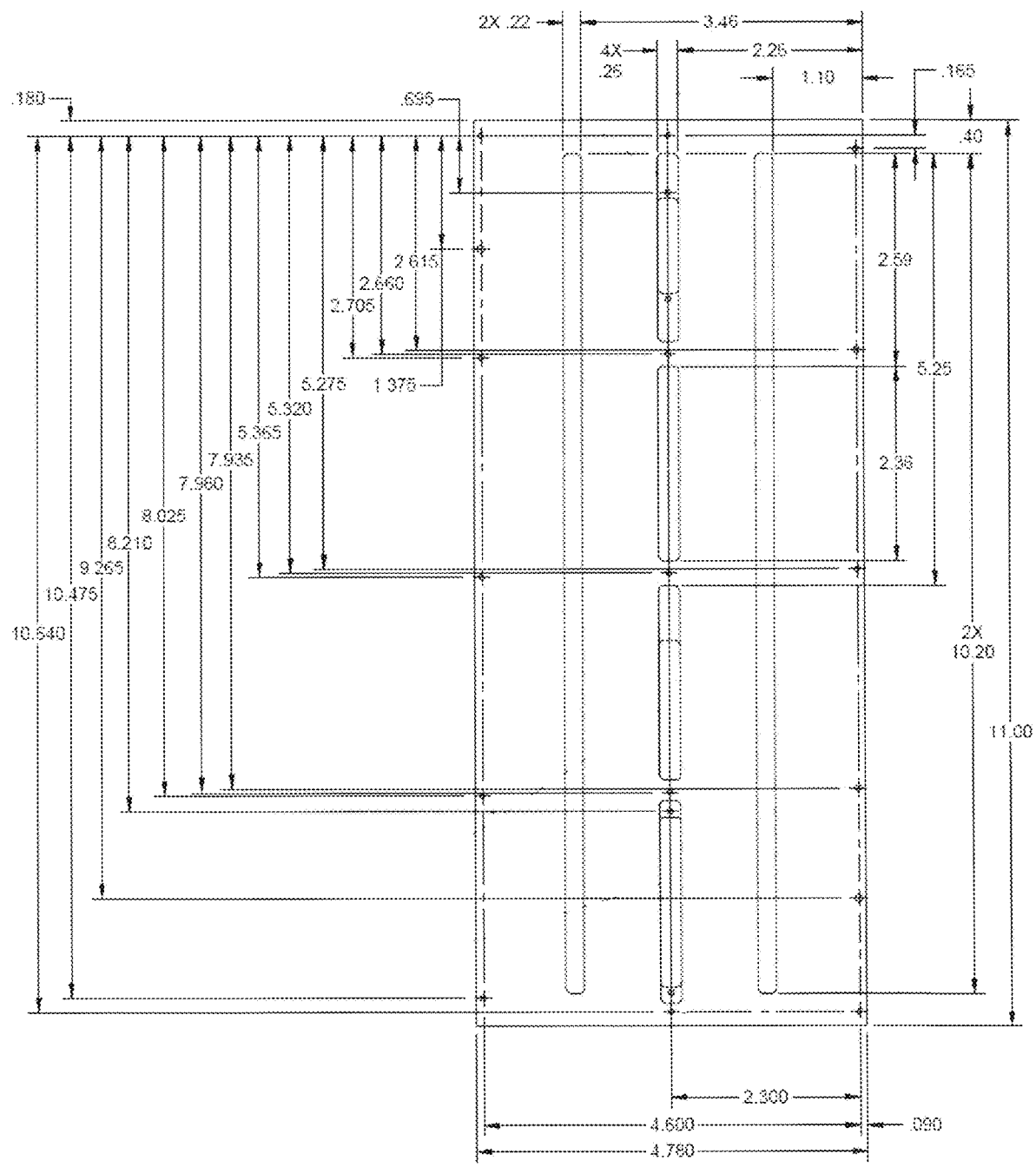
FIG. 20A is the front view of FIG. 20, but is shown with dimensions for one particular size heat exchanger for this embodiment of the stacked electronics package.
Figure 21A:
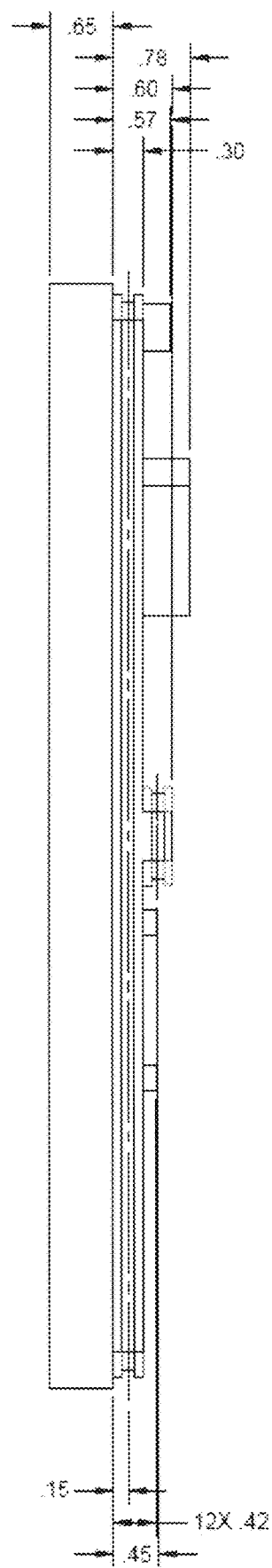
FIG. 21A is a side view of the heat exchanger of FIG. 20A, also shown with dimensions for that particular size heat exchanger.
Figure 22A:
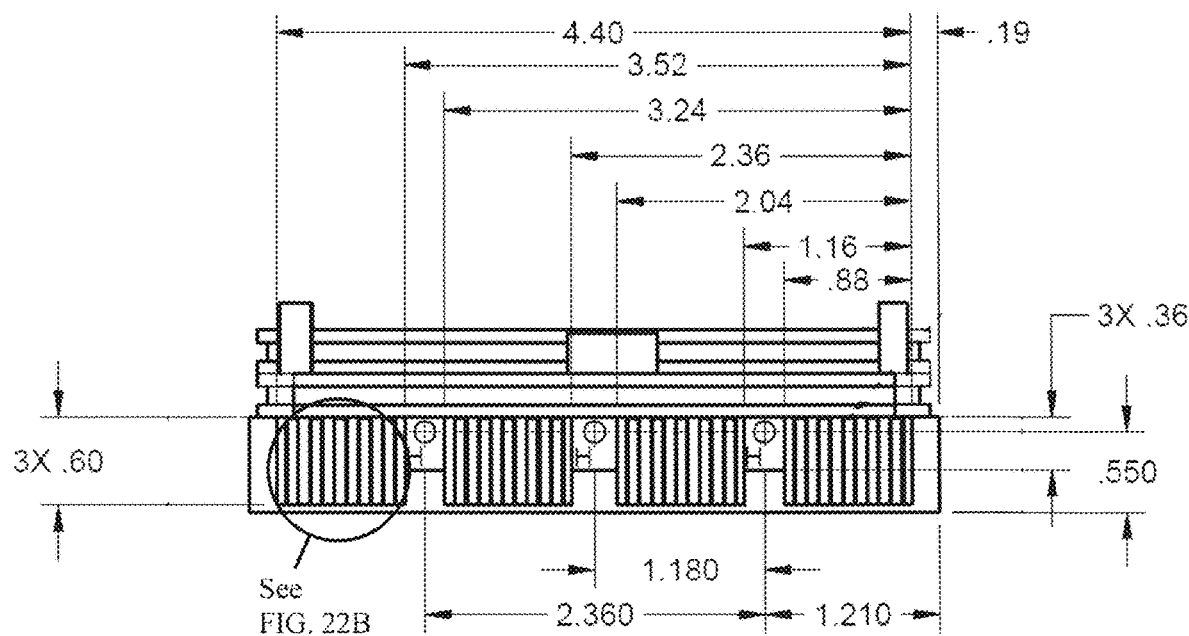
FIG. 22A is a top view of the heat exchanger of FIG. 20A, also shown with dimensions for that particular size heat exchanger.
Figure 22B:
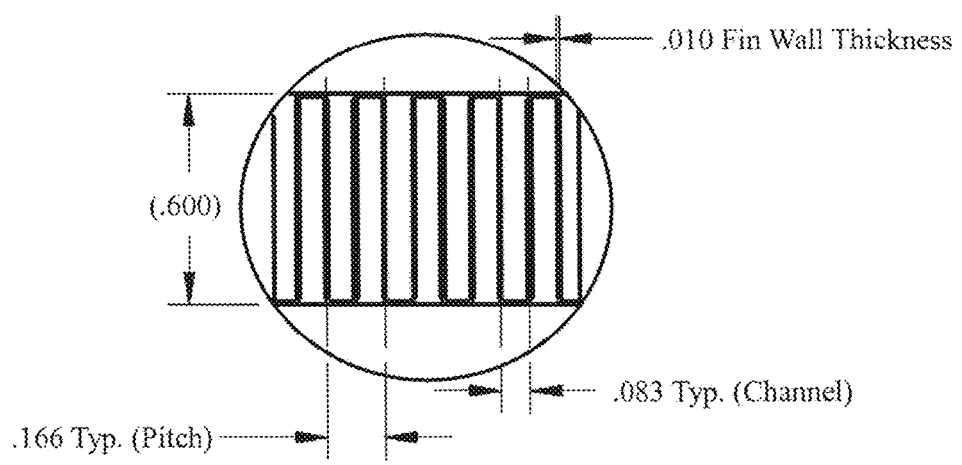
FIG. 22B is an enlarged detail view of the fins shown in the top view of FIG. 22A.
Figure 25:
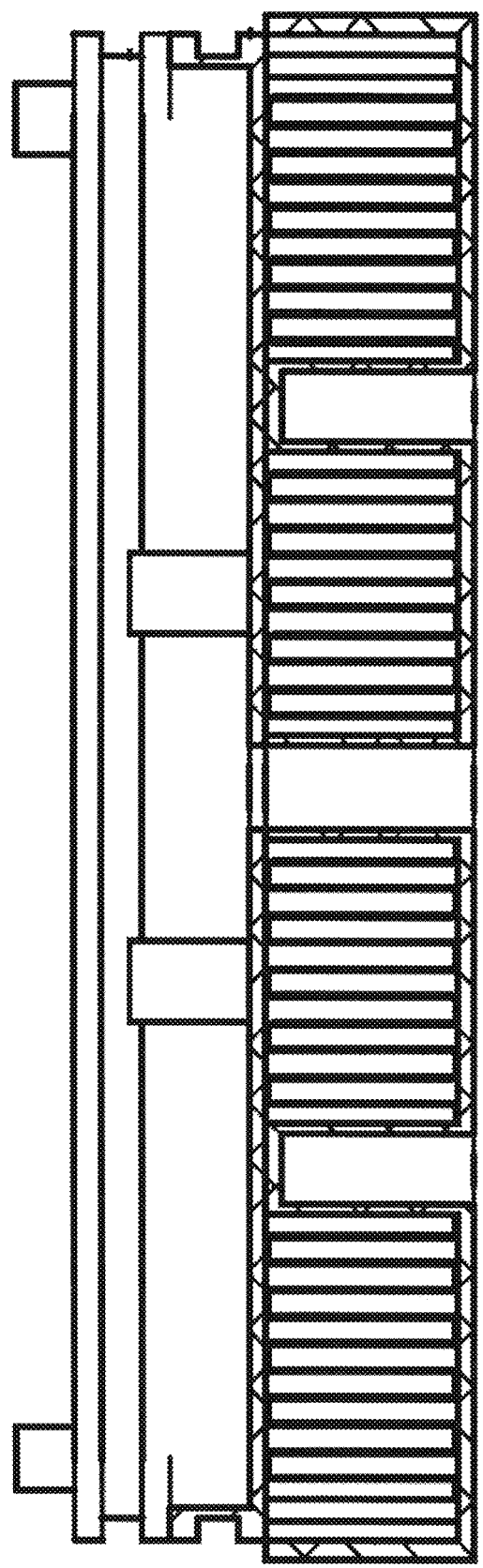
FIG. 25 is a first section cut through the heat exchanger as shown in FIG. 22.
Figure 28:
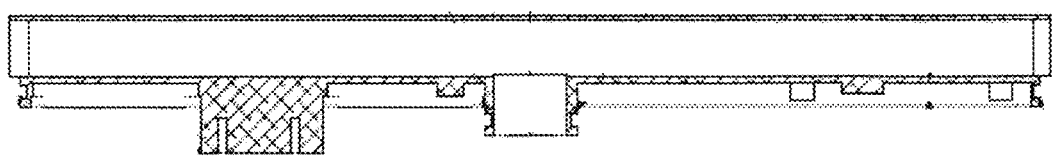
FIG. 28 is a second section cut through the heat exchanger as shown in FIG. 22.
Figure 27:
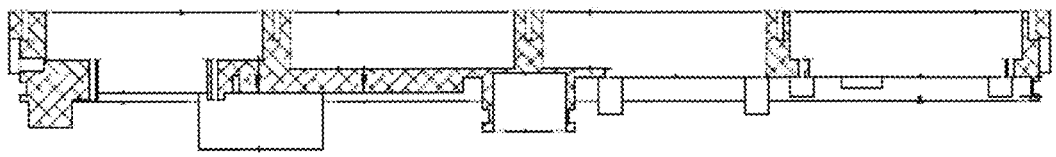
FIG. 27 is a section cut through the heat exchanger as shown in FIG. 20.
Figure 26:
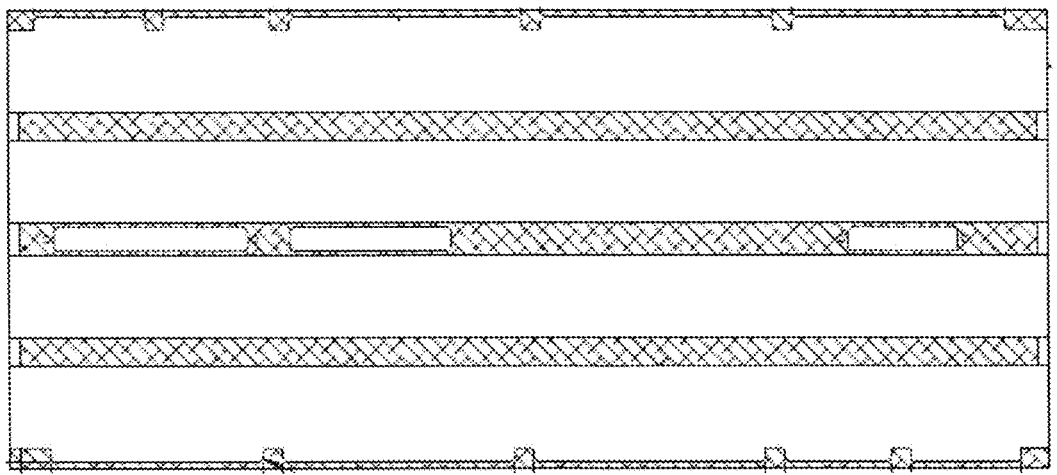
FIG. 26 is a section cut through the heat exchanger as shown in FIG. 23.
Figure 30:
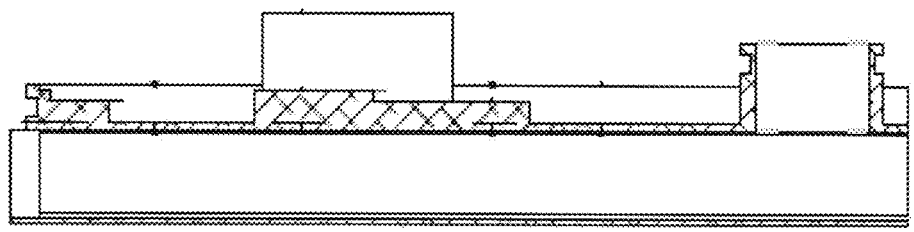
FIG. 30 is a fourth section cut through the heat exchanger as shown in FIG. 22.
Figure 29:
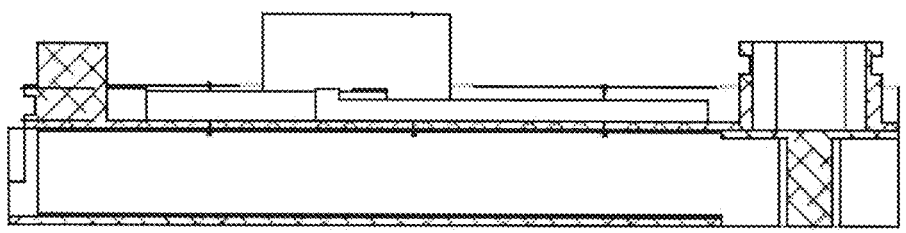
FIG. 29 is a third section cut through the heat exchanger as shown in FIG. 22.

The heat exchanger 140 is shown in FIGS. 16-18, and is configured to take in cool air from each of its opposite ends, and may thus have a first air intake 141 and a second air intake 142. The air passes through continuous high-density fins 144 in each of the two flow directions (see FIG. 19), and exits at a common exhaust plenum 143. As shown in FIG. 22B, in one embodiment, the fins 144 may be made of a single sheet of material that may be formed into a series of alternating channel shapes (i.e., being formed into a rectangular-shaped step pattern, as seen in an end view). The high density fin arrangement may be attained by using a spacing between the steps of the pattern, as shown for the embodiment in FIG. 22, which may preferably be between 0.76 mm and 3.30 mm (0.03 inches and 0.13 inches), and may more preferably be between 1.52 mm and 2.54 mm (0.06 inches and 0.10 inches), and may most preferably be between 2.03 mm and 2.159 mm (0.080 inches and 0.085 inches). Although greater surface area for heat transfer may be attained by having an even tighter spacing for the fins, a tighter spacing may also tend to undesirably restrict/limit air flow.

Figure 32:
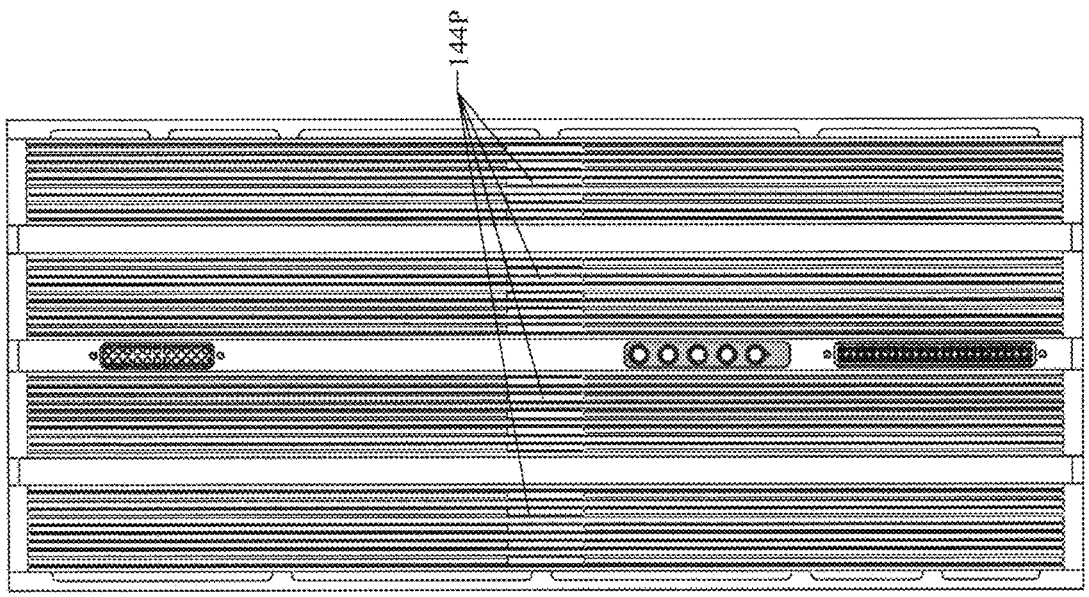
FIG. 32 is a front view of the heat exchanger, as shown in FIG. 31, with a portion of the housing removed to expose the high density fins.
Figure 31:
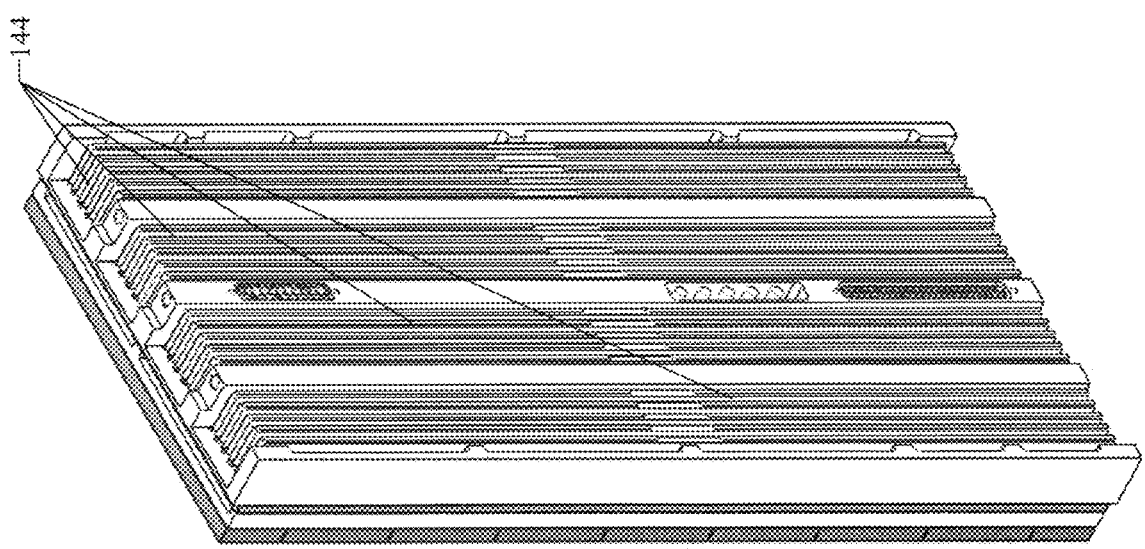
FIG. 31 is a perspective view of the heat exchanger, as shown in FIG. 17, with a portion of the housing removed to expose the high density fins.
Figure 33:
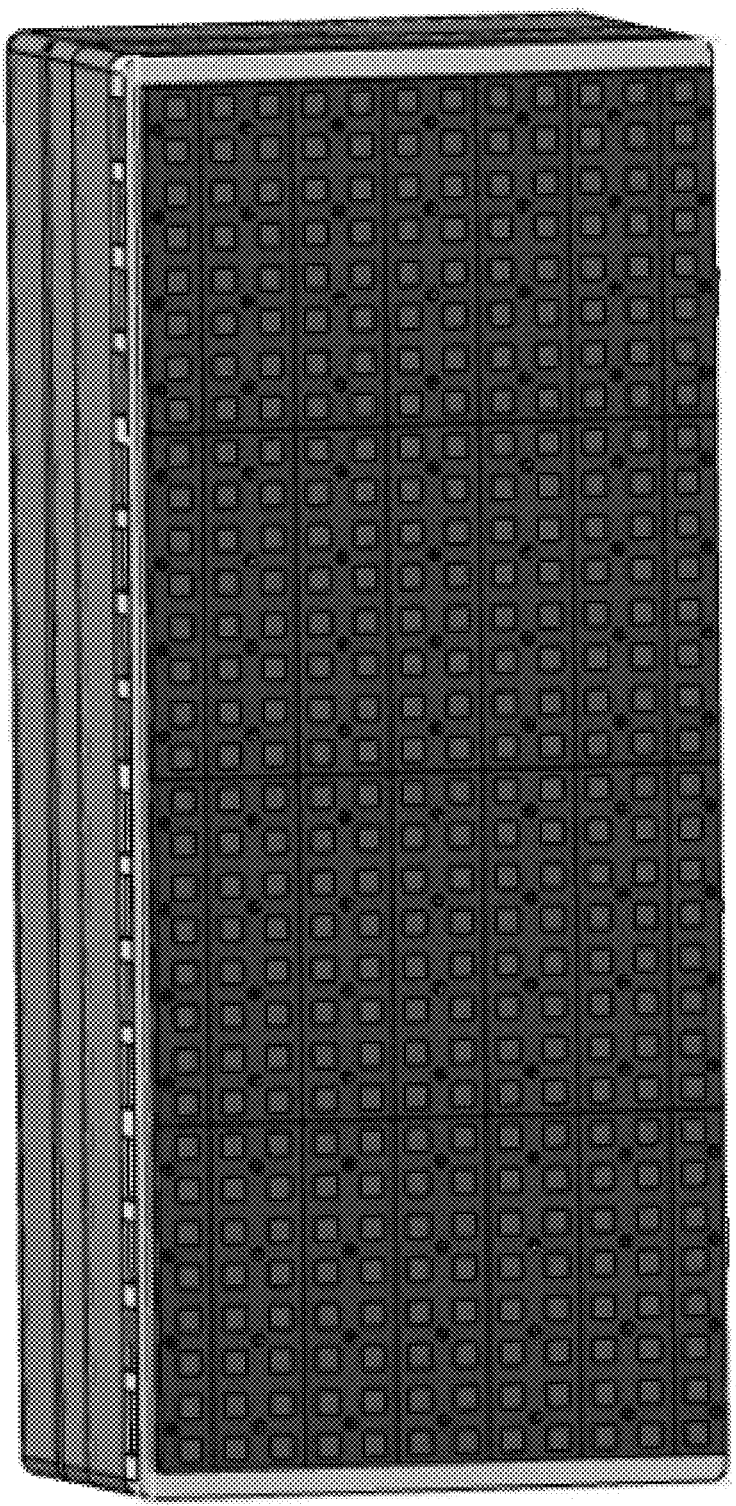
FIG. 33 illustrates a front perspective view of a four member array of stacked electronics packages, each formed in accordance with the embodiment of FIG. 1.
Figure 34:
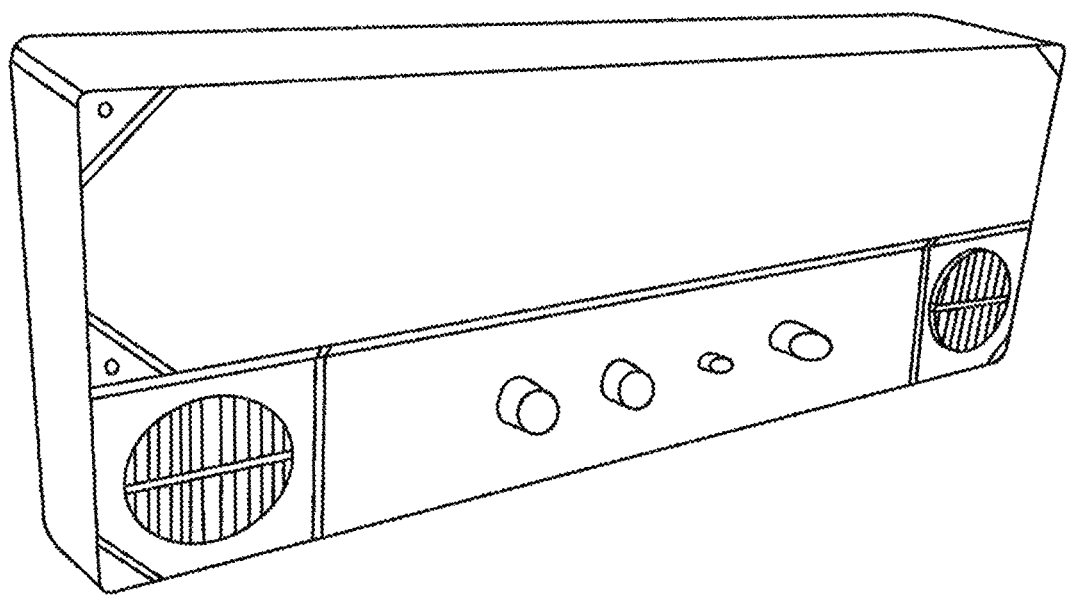
FIG. 34 is a rear perspective view of the array of stacked electronics packages shown in FIG. 33.
Figure 35:
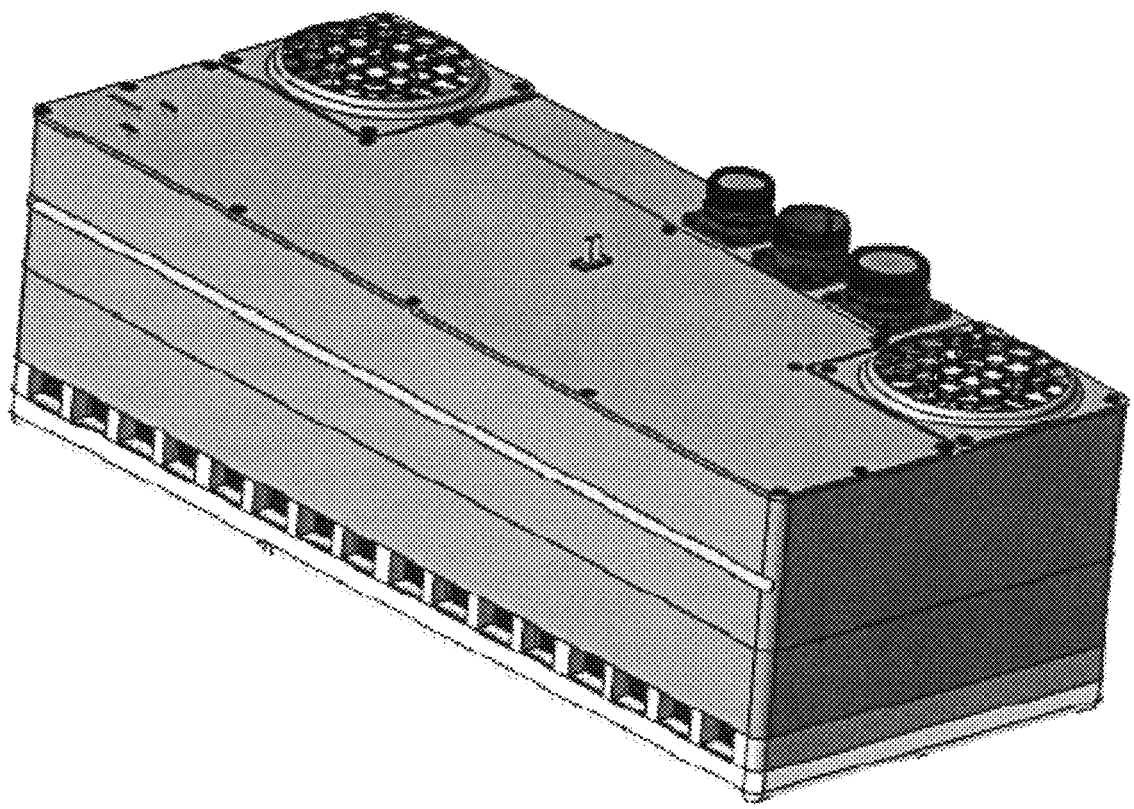
FIG. 35 is a top perspective view of the array of stacked electronics packages shown in FIG. 33, but showing a different connector arrangement on the rear face.

These fins 144, in one embodiment, may extend from the first inlet 140A (FIG. 22) all the way to the second inlet 140B (FIG. 23). The continuity of these fins 144 may be seen in FIGS. 31-32, in which a portion of the housing of the heat exchanger is shown removed. Small linear openings 144P, as shown in FIGS. 31-32, may be formed in the side of the channel shapes that would otherwise block the outflow of air at the exhaust plenum, which is preferably centrally located on the heat exchanger. To provide for equal cooling of both halves of the heat exchanger, the same pressure may be used to induce the same air flow rate through the fins 144 between the first inlet 140A and the exhaust plenum 140C, and between the second inlet 140B and the exhaust plenum 140C. Alternatively or additionally, a radiused flow diverter (see e.g., U.S. Pat. No. 5,101,711 to Durbin) may be formed in or secured into each channel at the exhaust plenum 140C to separate the air flow at the exit, and better direct the air flow out from the heat exchanger. Without the diverter, a significant pressure differential could cause the flow from one side to counter a portion of the outflow from the low pressure side.

This heat exchanger 140 permits more efficient cooling of high power density electronics using an air-cooled arrangement, eliminating the need for a complex liquid-cooled system to achieve a similar level of performance. The heat exchanger 140, with its dual intakes 141/142 and single exhaust plenum 143, provides a compact envelope with a reduced overall thickness that minimizes the space utilized, and also exhibits a reduced pressure drop, because it uses a shorter and/or more efficient air passage, allowing for an increased flow rate. This permits the use of a smaller, less powerful, and quieter fan or fans. The configuration of heat exchanger 140 also thereby minimizes the temperature gradient across its baseplate (i.e., the longer the flow path created by the fins the hotter the air will become, and longer fins create more resistance, tending to reduce the flow rate for a particular fan size, which causes the air to heat even further as it moves more slowly across the tins).

Figure 36:
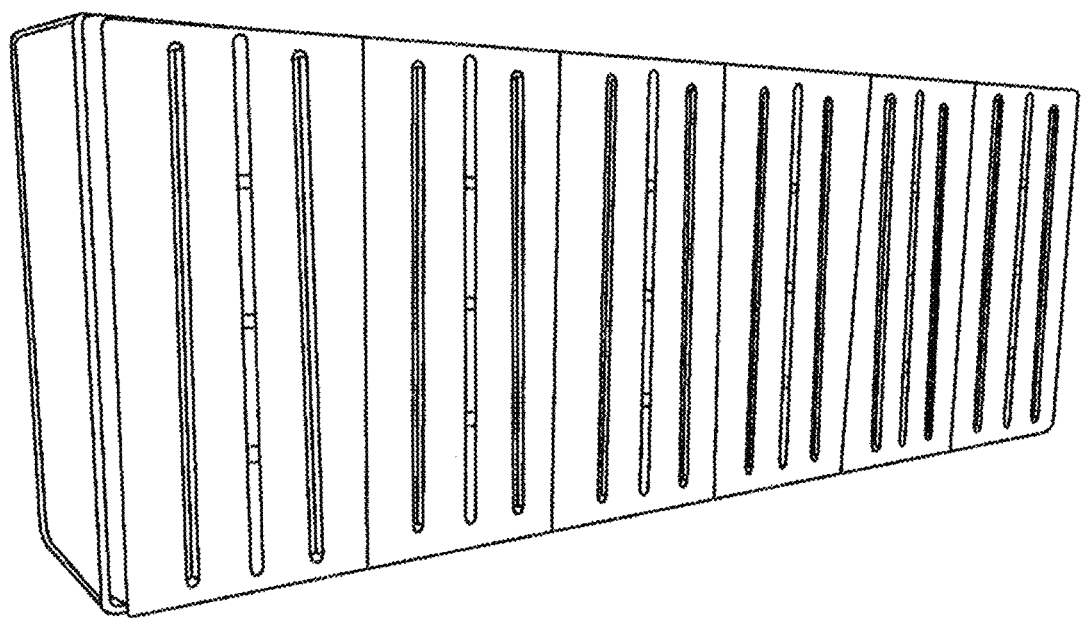
FIG. 36 illustrates a front perspective view of a six member array of stacked electronics packages, each formed in accordance with of the embodiment of FIG. 1.
Figure 39:
FIG. 39 is a cross-sectional view through the heat exchanger of FIG. 37.

FIG. 36A is a cross-sectional view through a stacked electronics package in accordance with one or more embodiments disclosed herein (e.g., see FIGS. 33-36), showing a flow path from the inlets and through the heat exchanger 140, and out the heat exchanger outlet, through a conduit and through a pair of fans (180A and 180B) that generate the air flow, with the flow exiting at an exterior portion of one side of the stacked electronics package.

Figure 37:
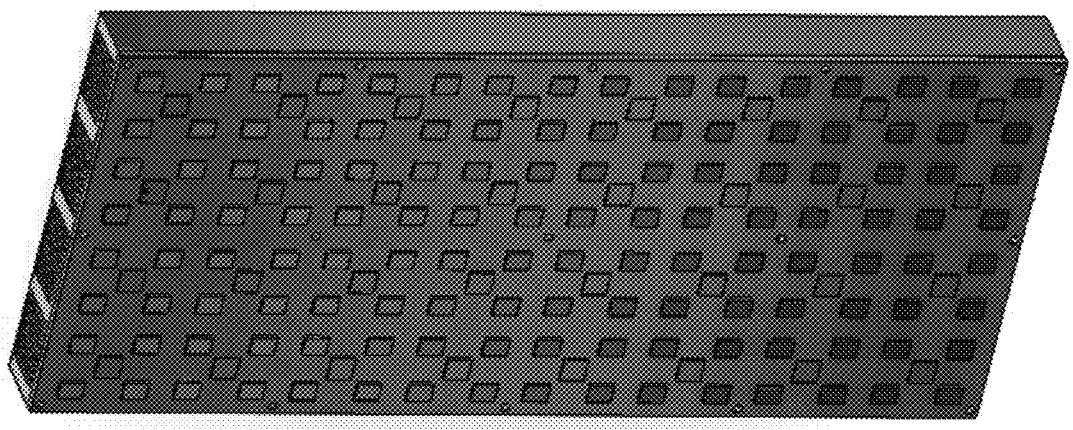
FIG. 37 is a colored thermal plot of a second embodiment of a heat exchanger formed to be different than the heat exchanger of FIGS. 16-18, as it has air intake at only one end, and air exhaust at the other end.
Figure 38:
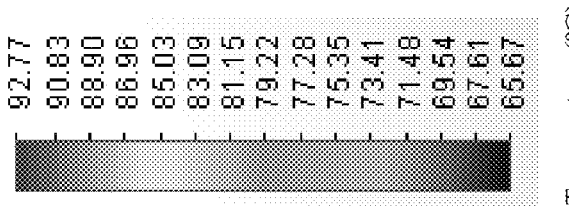
FIG. 38 is a colored bar chart with graduated markings to indicate corresponding temperatures for colored regions therein, which correspond to the colored regions of the thermal plot of the heat exchanger of FIG. 37.
Figure 42:
FIG. 42 is a cross-sectional view through the heat exchanger of FIG. 40.
Figure 40:
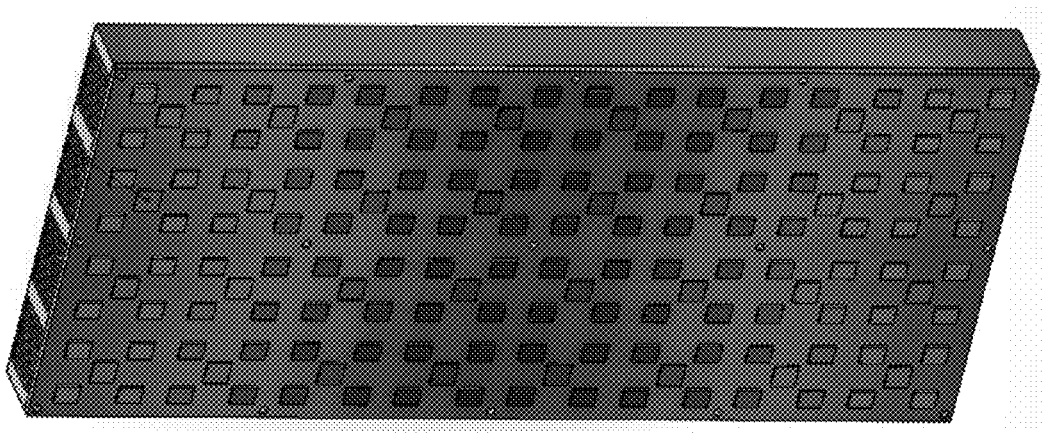
FIG. 40 is a colored thermal plot of the heat exchanger of FIGS. 16-18, which has an air intake at each end, and air exhaust at the center of the heat exchanger.
Figure 41:
FIG. 41 is a colored bar chart with graduated markings to indicate corresponding temperatures for colored regions therein, which correspond to the colored regions of the thermal plot of the heat exchanger of FIG. 40.

Test result of these improvements for the heat exchanger disclosed herein may be seen in comparing FIGS. 40-41 with FIGS. 37-38.

FIG. 40 is a colored thermal plot of the heat exchanger disclosed herein, having an air intake at each end, and air exhaust at the central exhaust plenum, and which may be formed to be sized according to the dimensions shown in FIGS. 20A, 21A, 22A, and 22B.

FIG. 41 is a colored bar chart with graduated markings to indicate temperatures that correspond to the colored regions therein, which may be used to identify temperatures at each of the colored regions of the thermal plot for the heat exchanger of FIG. 40;

FIG. 37 is a colored thermal plot of a second embodiment of a heat exchanger formed to be different than the heat exchanger of FIGS. 16-18 and FIGS. 20A, 21A. 22A, and 22B, as it has air intake at only one end, and air exhaust at the opposite end;

The heat exchanger 140 with a double inlet having an inlet at each of the opposite ends and the common central exhaust plenum serves to create a very uniform temperature gradient across all components within the electronic system.

Both FIG. 37 and FIG. 40 represent steady state conditions, but there is a difference in the maximum temperature reached; the single intake heat exchanger in FIG. 37 reaches a maximum temperature of 92.77° C., while the dual intake heat exchanger of FIG. 40 reaches a maximum temperature of 84.33° C., which temperature may result from a mass flow rate of about 3.2 lbs/min.

Figure 43:
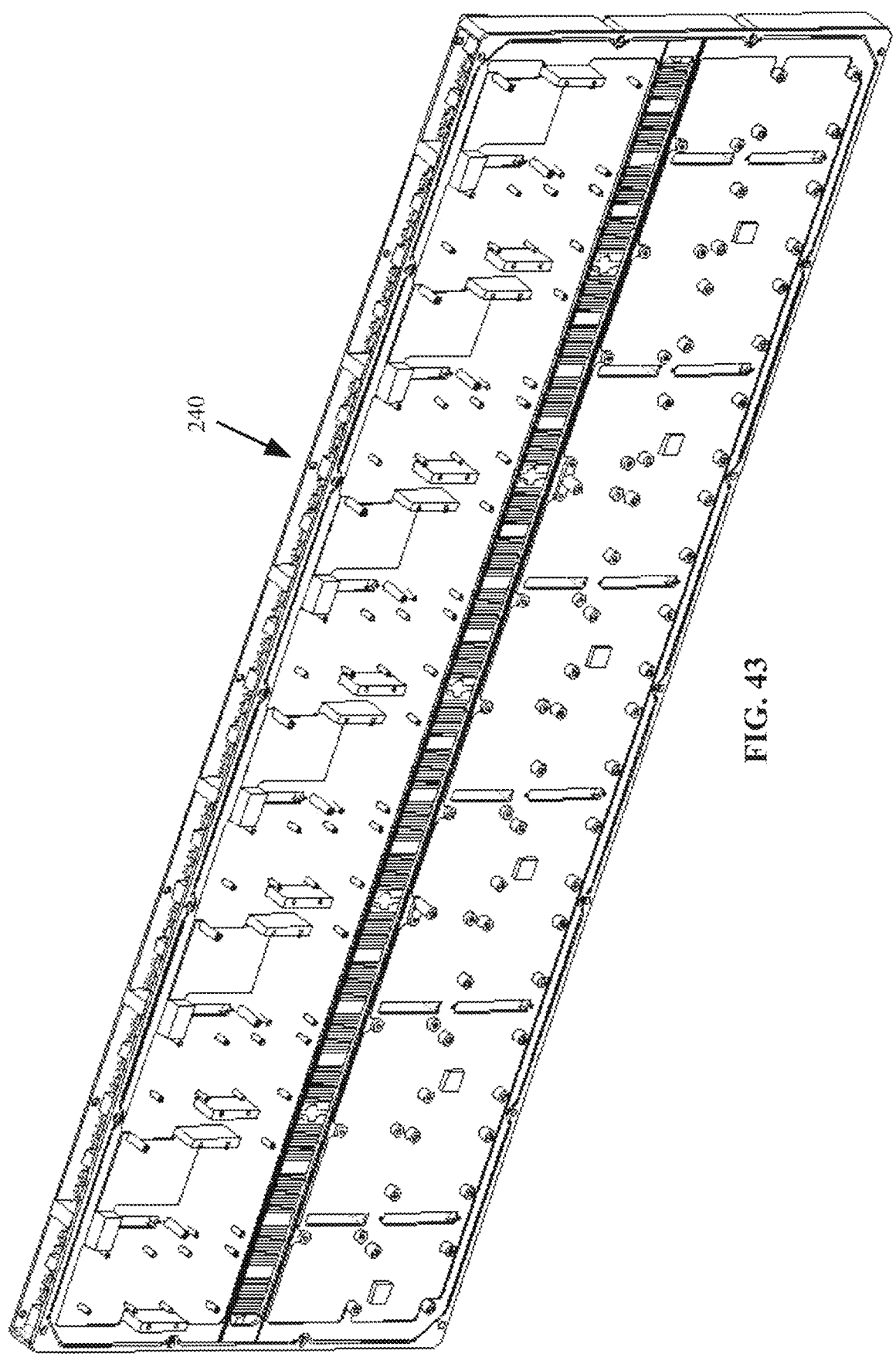
FIG. 43 is a rear perspective view of a multi-sectional heat exchanger assembly for an array of stacked electronics formed in accordance with the embodiment of FIG. 1.
Figure 44:
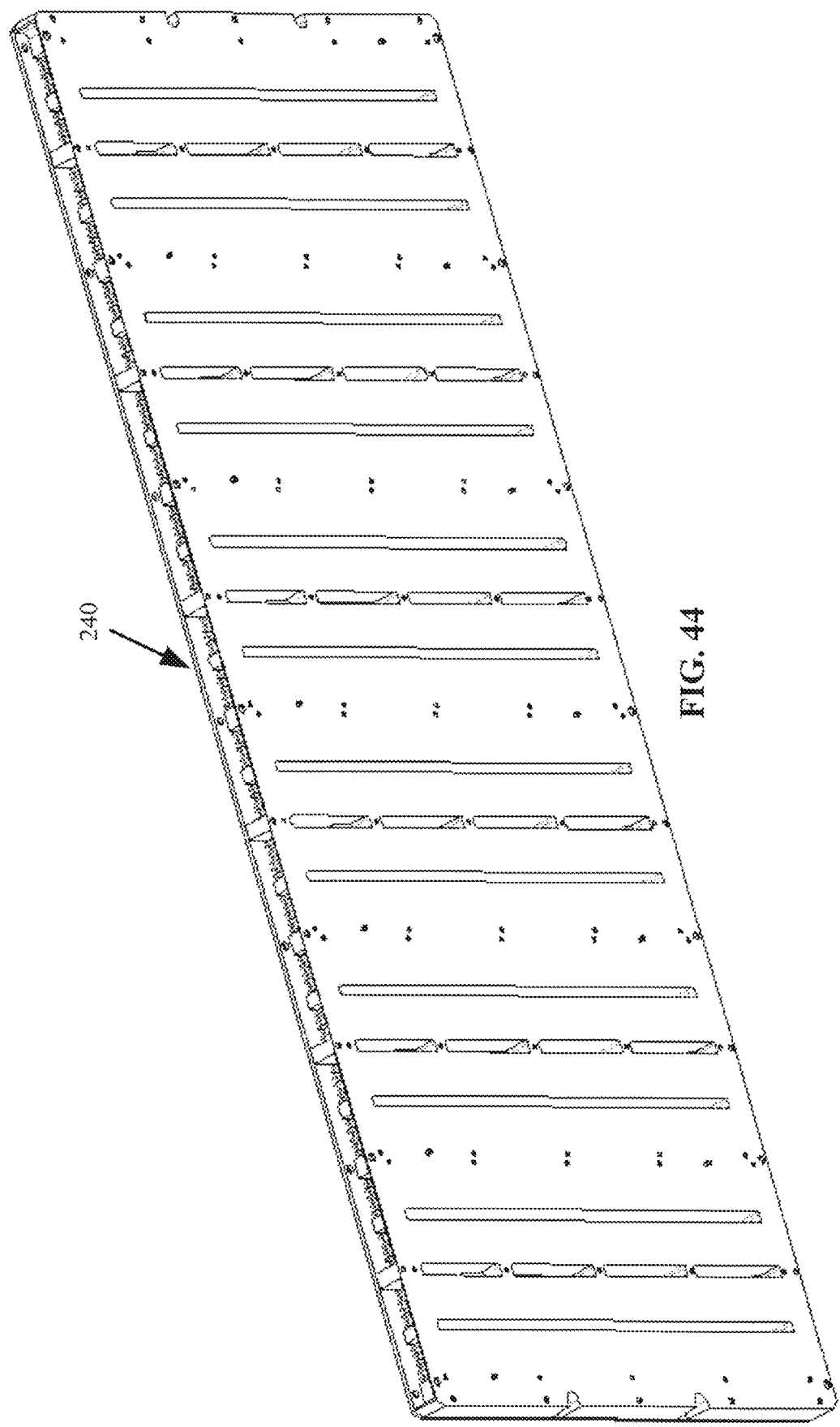
FIG. 44 is a front perspective view of the multi-sectional heat exchanger assembly shown in FIG. 43.

FIGS. 33-36 illustrate a multi-member array of stacked electronics packages, each formed in accordance with the embodiment of FIG. 1;

FIGS. 43-44 show rear and front perspective view of a multi-sectional heat exchanger assembly 240 that may be used for an array of stacked electronics formed in accordance with the embodiment of FIG. 1.

Figure 45:
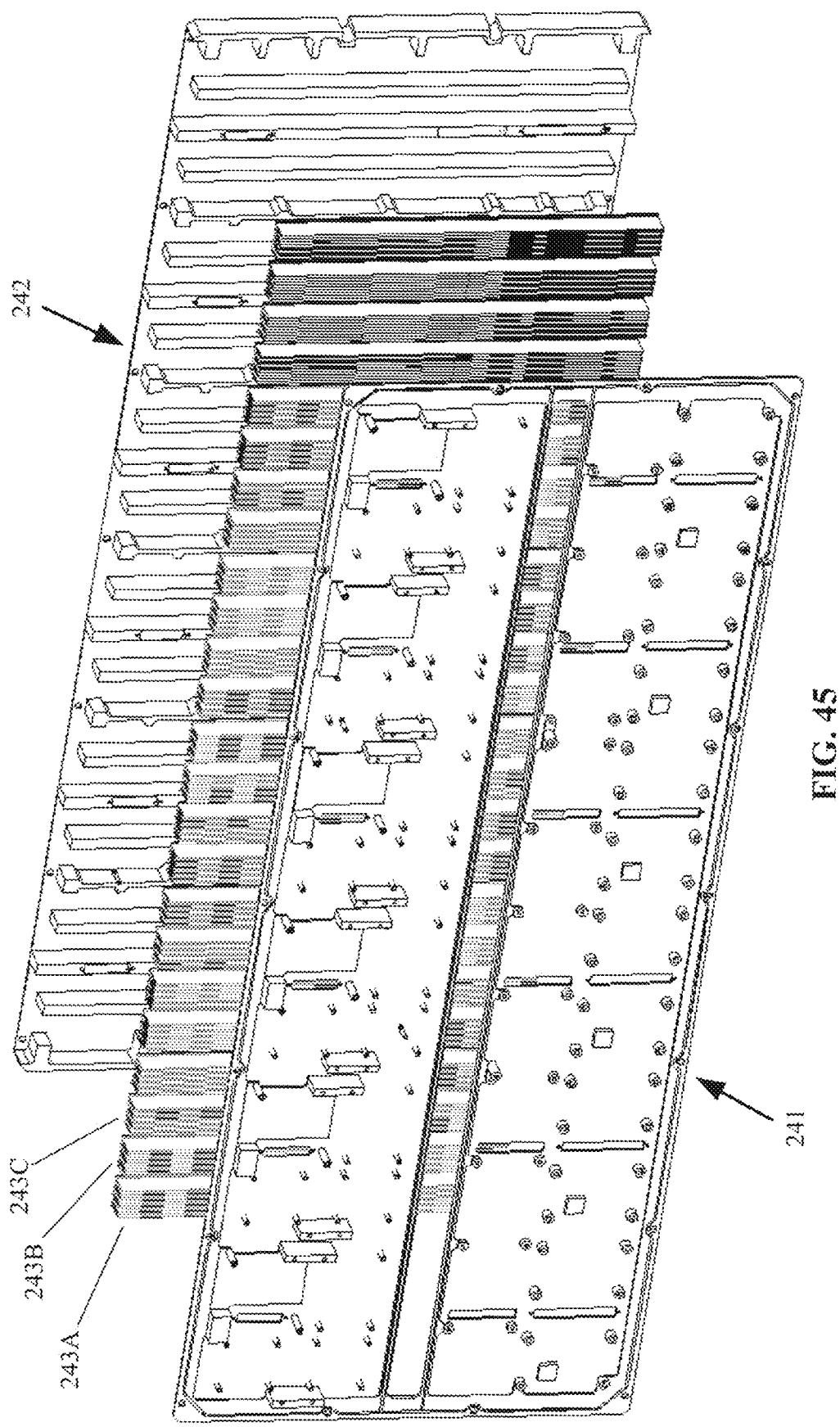
FIG. 45 is an exploded perspective view of the multi-sectional heat exchanger assembly shown in FIG. 43.
Figure 50:
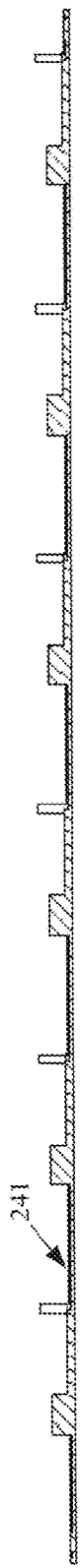
FIG. 50 is a first section cut through the rear housing plate as shown in FIG. 46.
Figure 51:
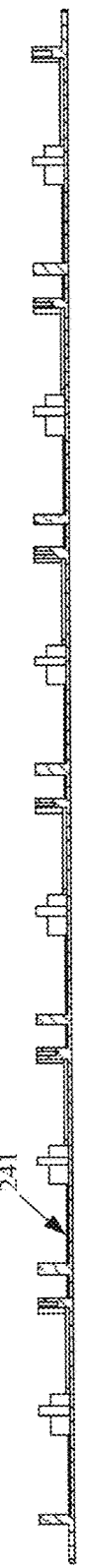
FIG. 51 is a second section cut through the rear housing plate as shown in FIG. 46.
Figure 52:
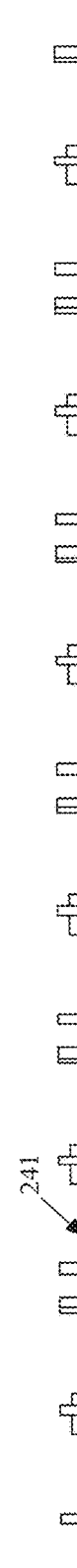
FIG. 52 is a third section cut through the rear housing plate as shown in FIG. 46.
Figure 53:
FIG. 53 is a fourth section cut through the rear housing plate as shown in FIG. 46.
Figure 54:
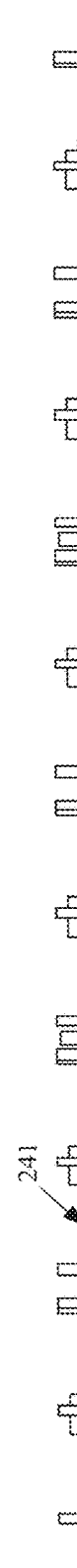
FIG. 54 is a fifth section cut through the rear housing plate as shown in FIG. 46.
Figure 55:
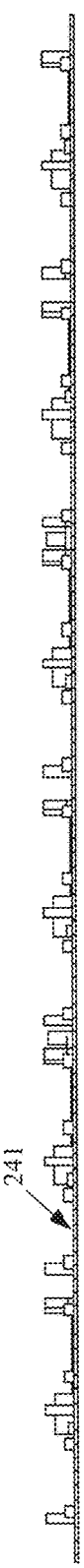
FIG. 55 is a sixth section cut through the rear housing plate as shown in FIG. 46.
Figure 56:
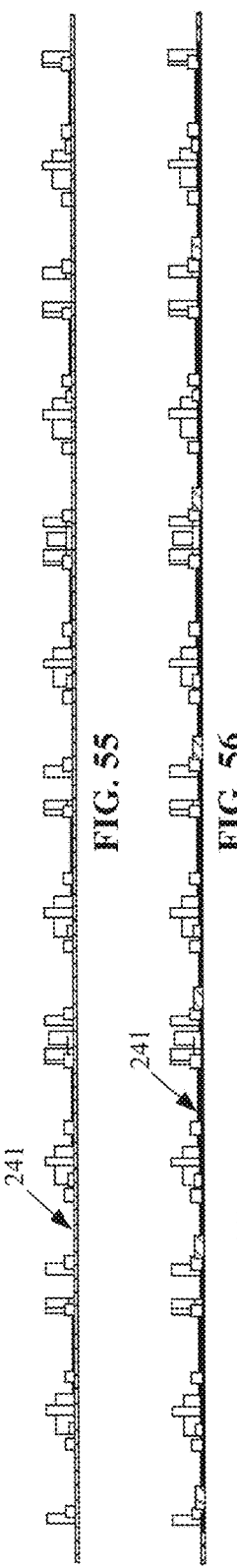
FIG. 56 is a seventh section cut through the rear housing plate as shown in FIG. 46.
Figure 57:
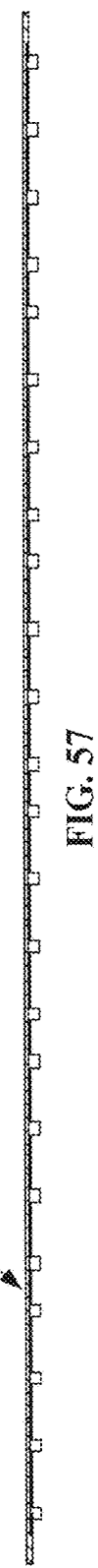
FIG. 57 is an eighth section cut through the rear housing plate as shown in FIG. 46.

The multi-sectional heat exchanger assembly 240 may include a rear housing plate 241, a front housing plate 242, and a plurality of high density fin sections (243A, 243B, 243C, etc.), as shown in the exploded perspective view of FIG. 45.

FIGS. 46-49 illustrate front, top, and left and right side views of the rear housing plate 241 of the multi-sectional heat exchanger assembly 240, which may have an opening 241P formed therein to accommodate the exhaust. The rear housing plate 241 may also be formed with a plurality of standoffs and holes to accommodate assembly, as shown thought the FIGS.

Figure 62:
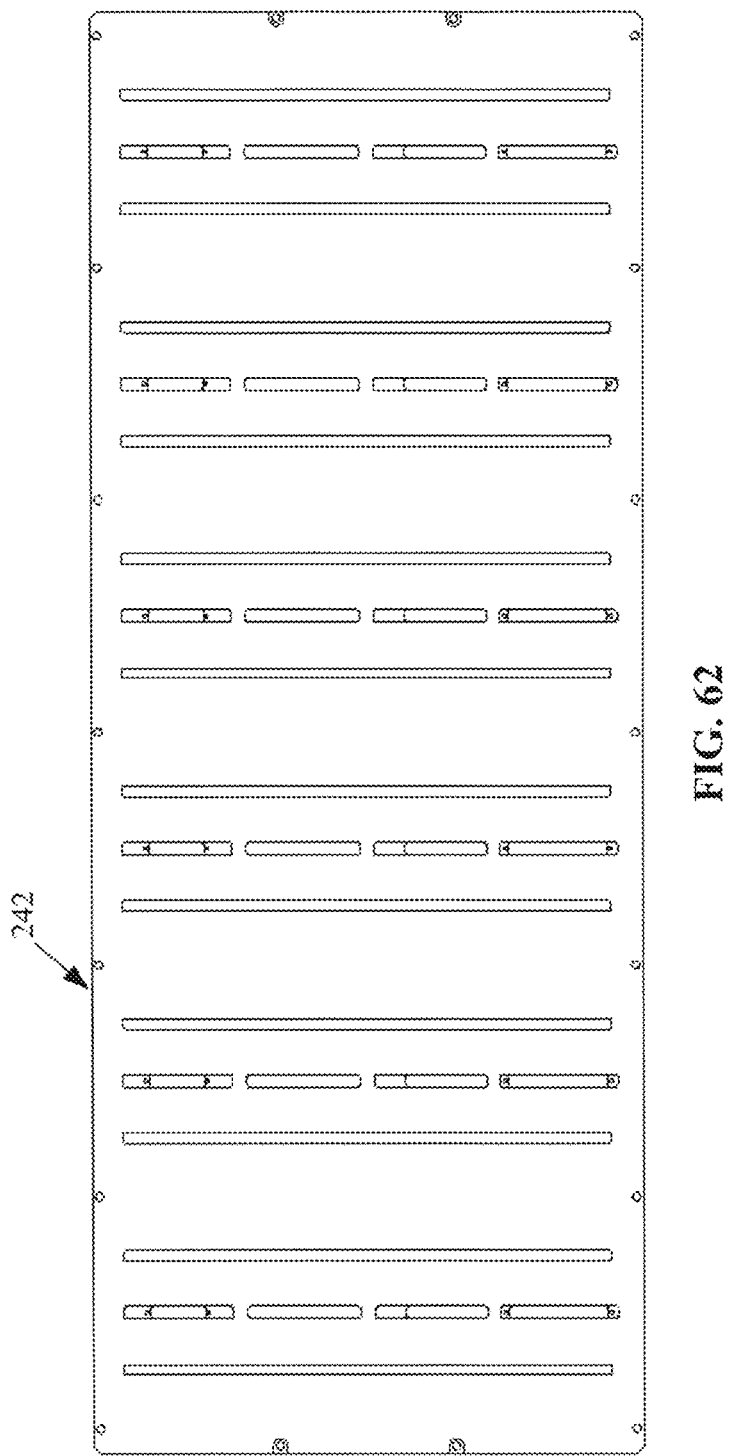
FIG. 62 is a rear view of the front housing plate shown in FIG. 58.
Figure 63:
FIG. 63 is a perspective view of an embodiment of a section of high density fins that may be used in the multi-sectional heat exchanger assembly shown in FIG. 43.
Figure 65:
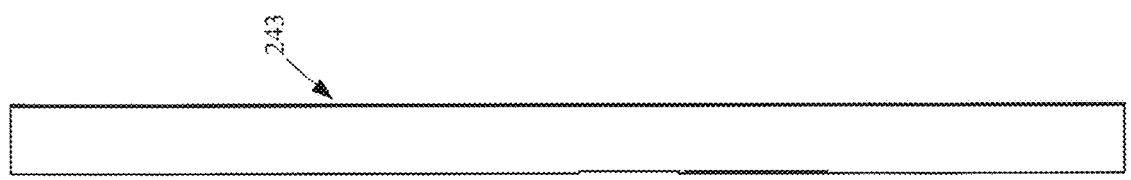
FIG. 65 is a front view of the high density tins shown in FIG. 64.
Figure 64:
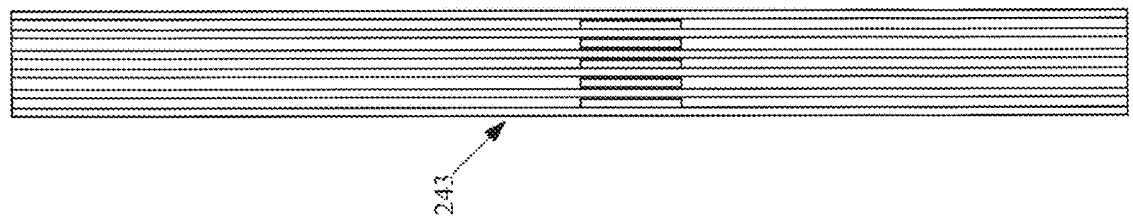
FIG. 64 is a front view of the high density fins shown in FIG. 63.
Figure 66:
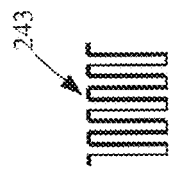
FIG. 66 is a top view of the high density fins shown in FIG. 64.

FIGS. 58-61 illustrate front, top, left side, and right side views of the front housing plate 242, which may be formed with a plurality of exterior and interior walls (e.g., 242Wi, 242Wii, 242Wiii, etc.) that are configured to support proper mounting with respect to the rear housing plate 241. The plurality of interior walls may also be configured to provide for separation between the sections of housing fins that may be mounted therein. FIG. 62 is a rear view of the front housing plate 242 shown in FIG. 58, and may include mounting holes and recesses as required for assembly and operation.

Figure 68:
FIG. 68 is a top view of the assembly of the front housing plate and high density tins, as shown in FIG. 67.
Figure 67:
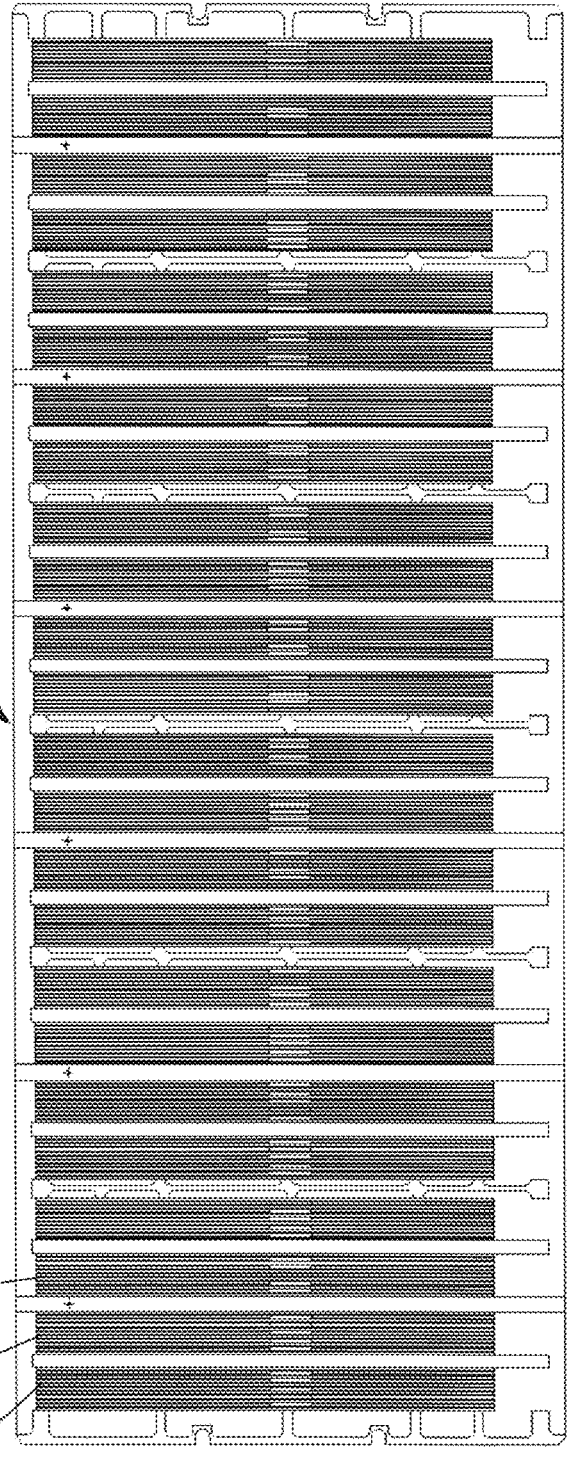
FIG. 67 is a front view showing the front housing plate of FIG. 58 with a plurality of the high density fin sections of FIG. 63 mounted within the channels of the front housing plate.
Figure 69:
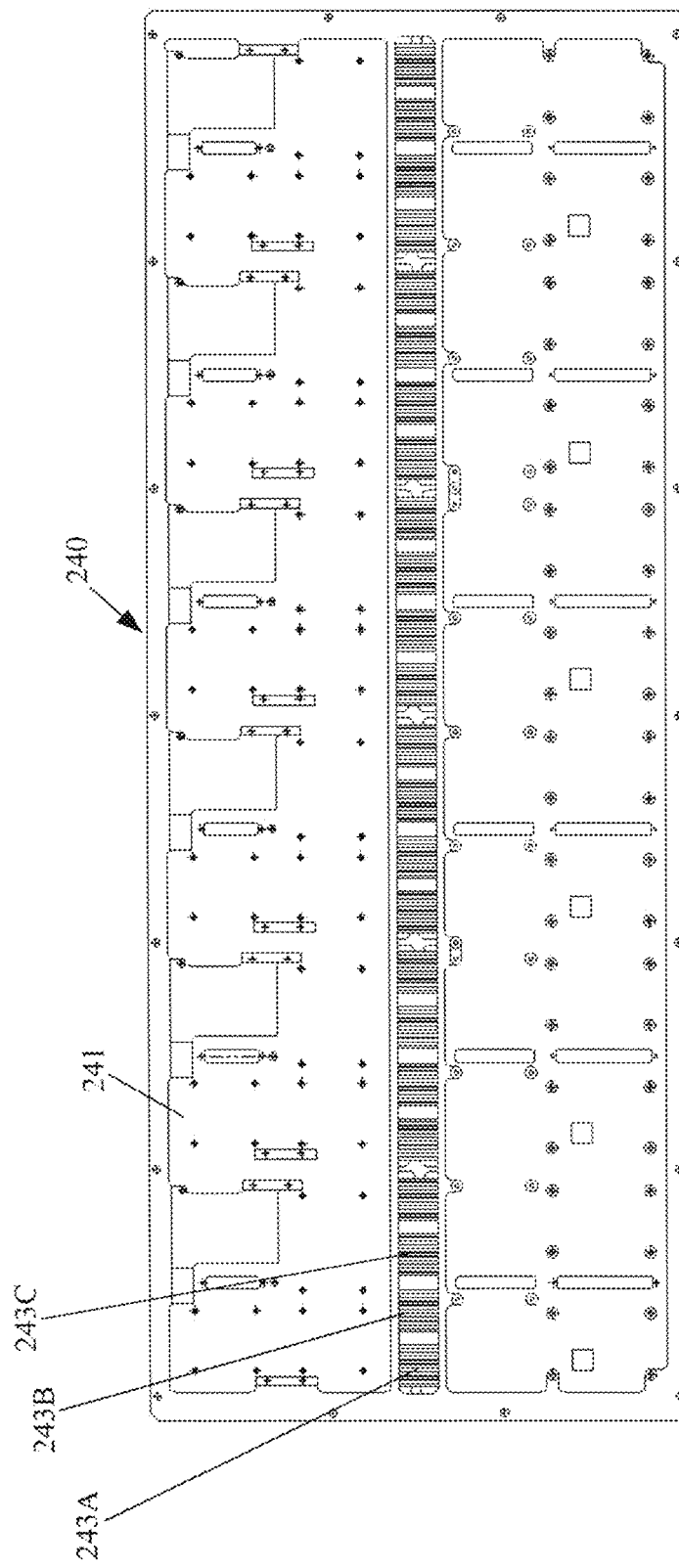
FIG. 69 is the front view of FIG. 67, but shown with the rear housing plate of FIG. mounted to the front housing plate to encase the high density fin sections therein.
Figures 70, 71, 72:
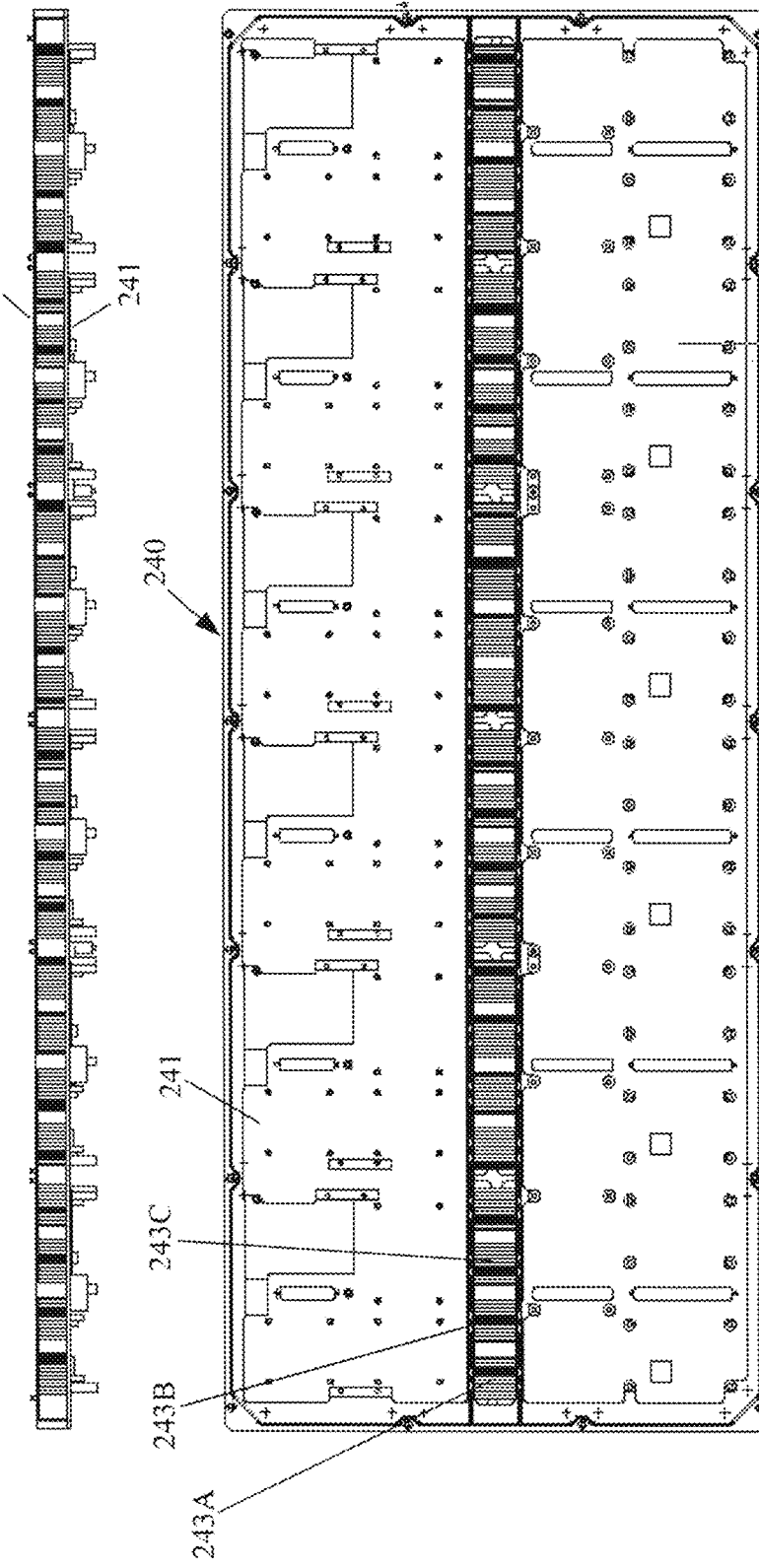
FIG. 70 is the front view of FIG. 69, shown with a peripheral groove formed in the rear housing plate.
FIG. 71 is a right side view of the assembled front housing plate, rear housing plate, and high density fin sections, as shown in FIG. 70.
FIG. 72 is a top view of the assembled front housing plate, rear housing plate, and high density tin sections, as shown in FIG. 70.

FIGS. 63-66 illustrate perspective, front, side and end views of an embodiment of a section of high density fins 243 that may be used in the multi-sectional heat exchanger assembly shown in FIG. 43;

FIGS. 67-68 are front and top views showing the front housing plate 242 with a plurality of the high density tin sections (e.g., 243A, 243B, 243C, etc.) mounted within the channels of the front housing plate.

FIG. 69-75 illustrate the rear housing plate 241 mounted to the front housing plate 242 to encase the high density tin sections (e.g., 243A. 243B, 243C, etc.) therein.

While illustrative implementations of one or more embodiments of the disclosed apparatus are provided hereinabove, those skilled in the art and having the benefit of the present disclosure will appreciate that further embodiments may be implemented with various changes within the scope of the disclosed apparatus. Other modifications, substitutions, omissions and changes may be made in the design, size, materials used or proportions, operating conditions, assembly sequence, or arrangement or positioning of elements and members of the exemplary embodiments without departing from the spirit of this invention.

Accordingly, the breadth and scope of the present disclosure should not be limited by any of the above-described example embodiments, but should be defined only in accordance with the following claims and their equivalents.

What is claimed is:

1. An air-cooled heat exchanger comprising:
 a casing, said casing having a first end and a second end and being elongated in an axial direction between said first end and said second end, said casing comprising an accommodating space with a first air inlet into said accommodating space, a second air inlet into said accommodating space, and an air outlet positioned on a first side of said casing between said first air inlet and said second air inlet;
 wherein said first air inlet is positioned at said first end of said casing, and said second air inlet is positioned at said second end of said casing;
 wherein said air outlet is centrally positioned on said first side of said casing, being substantially midway between said first air inlet and said second air inlet;
 a first plurality of high density fins, said first plurality of high density fins positioned within the accommodating space between said first air inlet and said air outlet to define a first flow path;

a second plurality of high density fins, said second plurality of high density fins positioned within the accommodating space between said second air inlet and said air outlet to define a second flow path; wherein said second flow path is separated from said first flow path;

wherein a direction of said first flow path in said first plurality of fins between said first air inlet and said air outlet is opposite to a direction of said second flow path in said second plurality of fins between said second air inlet and said air outlet, to exchange heat away from an entire length in the axial direction of a second side and from at least a majority of a length of said first side of said elongated casing; and a fan positioned to drive air into each of said first air inlet and said second air inlet.

2. The air-cooled heat exchanger according to claim 1, wherein each of said first and second plurality of high density fins comprise a sheet of material formed into a rectangular-shaped step pattern; and wherein each of said fins comprises an opening configured to permit air flow into said centrally positioned air outlet.

3. The air-cooled heat exchanger according to claim 2, wherein a spacing for each step of said rectangular-shaped step pattern is between 0.76 mm and 3.30 mm (0.03 inches and 0.13 inches).

4. The air-cooled heat exchanger according to claim 2, wherein a spacing for each step of said rectangular-shaped step pattern is between 1.52 mm and 2.54 mm (0.06 inches and 0.10 inches).

5. The air-cooled heat exchanger according to claim 2, wherein a spacing for each step of said rectangular-shaped step pattern is between 2.03 mm and 2.159 mm (0.080 inches and 0.085 inches).

6. The air-cooled heat exchanger according to claim 2, wherein said air outlet is oriented to provide an exit flow path that is substantially perpendicular to each of said first flow path and said second flow path.

* * * * *